US008685821B2

(12) United States Patent
Eom et al.

(10) Patent No.: US 8,685,821 B2
(45) Date of Patent: Apr. 1, 2014

(54) VERTICAL CHANNEL MEMORY DEVICES WITH NONUNIFORM GATE ELECTRODES AND METHODS OF FABRICATING THE SAME

(71) Applicants: Daehong Eom, Hwaseong-si (KR); Kyunghyun Kim, Seoul (KR); Kwangsu Kim, Seoul (KR); Jun-Youl Yang, Seoul (KR); Se-Ho Cha, Goyang-si (KR)

(72) Inventors: Daehong Eom, Hwaseong-si (KR); Kyunghyun Kim, Seoul (KR); Kwangsu Kim, Seoul (KR); Jun-Youl Yang, Seoul (KR); Se-Ho Cha, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/020,192

(22) Filed: Sep. 6, 2013

(65) Prior Publication Data
US 2014/0004676 A1 Jan. 2, 2014

Related U.S. Application Data

(62) Division of application No. 13/689,176, filed on Nov. 29, 2012, now Pat. No. 8,552,489.

(30) Foreign Application Priority Data

Nov. 29, 2011 (KR) .................. 10-2011-0126013

(51) Int. Cl.
*H01L 21/336* (2006.01)
(52) U.S. Cl.
USPC ............... 438/268; 438/283; 257/E21.209
(58) Field of Classification Search
USPC ............ 438/173, 176, 192; 257/E21.532, 257/E21.613
See application file for complete search history.

(56) References Cited

U.S. PATENT DOCUMENTS

2010/0207185 A1 8/2010 Lee et al.
2011/0002178 A1 1/2011 Hwang et al.

FOREIGN PATENT DOCUMENTS

KR 1020100079978 A 7/2010

*Primary Examiner* — Cheung Lee
(74) *Attorney, Agent, or Firm* — Myers Bigel Sibley & Sajovec, P.A.

(57) ABSTRACT

A mold stack including alternating insulation layers and sacrificial layers is formed on a substrate. Vertical channel regions extending through the insulation layers and sacrificial layers of the mold stack are formed. Gate electrodes are formed between adjacent ones of the insulation layers and surrounding the vertical channel regions. The gate electrodes have a greater thickness at a first location near sidewalls of the insulation layers than at a second location further away from the sidewalls of the insulation layers.

15 Claims, 59 Drawing Sheets

VERTICAL CHANNEL MEMORY DEVICES WITH NONUNIFORM GATE ELECTRODES AND METHODS OF FABRICATING THE SAME

CROSS-REFERENCE TO RELATED APPLICATIONS

The present application is a divisional of and claims priority from U.S. patent application Ser. No. 13/689,176, filed Nov. 29, 2012, which claims priority from Korean Patent Application No. 10-2011-0126013, filed on Nov. 29, 2011, the entirety of which is incorporated by reference herein.

BACKGROUND

1. Technical Field

The present disclosure relates to semiconductor devices and, more particularly, to semiconductor memory devices and methods of fabricating the same.

2. Description of Related Art

Semiconductor devices may be attractive to the electronics industry because of their small size, multi-function capabilities, and/or low fabrication costs. For example, high-performance semiconductor devices and/or low-cost semiconductor devices have experienced increased demand with the development of the electronics industry. In order to address these demands, semiconductor devices have become more highly-integrated. In particular, the integration density of semiconductor memory devices has increased to store more logic data.

A planar area occupied by a unit memory cell may directly affect the integration density of two-dimensional semiconductor memory devices. In other words, the integration density of the two-dimensional semiconductor memory devices may be influenced by a minimum feature size that relates to a process technology for forming fine patterns. However, there may be limitations in improving the process technology for forming the fine patterns. Additionally, high-cost equipment or apparatuses may be required to form the fine patterns. Thus, the costs of fabricating highly-integrated semiconductor memory devices may be relatively high. Three-dimensional semiconductor memory devices have been proposed to address some of the above limitations.

SUMMARY

Exemplary embodiments of the inventive subject matter are directed to methods of fabricating a semiconductor memory device and semiconductor devices fabricated thereby.

Some embodiments of the inventive subject matter provide methods of forming memory devices. A mold stack including alternating insulation layers and sacrificial layers is formed on a substrate. Vertical channel regions extending through the insulation layers and sacrificial layers of the mold stack are formed. Portions of the sacrificial layers in a first part of the mold stack are removed to form first spaces, leaving portions of the sacrificial layers remaining between the insulation layers in a second part of the mold stack. The first spaces are enlarged by removing portions of the insulating layers and/or the vertical channel regions. The remaining portions of the sacrificial layers in the second part of the mold stack are removed to form second spaces between the insulating layers after enlarging the first spaces. Gate electrodes are formed in the first and second spaces.

In some embodiments, the first part of the mold stack includes an outer portion and the second part of the mold stack includes an inner portion. According to some embodiments, forming gate electrodes is preceded by forming at least one data storage layer on sidewalls of the vertical channel regions and forming gate electrodes includes forming the gate electrodes on the at least one data storage layer.

According to some embodiments, enlarging the first spaces includes increasing a width of the first spaces and/or increasing a height of the first spaces. Increasing a height of the first spaces may include removing exposed portions of the insulation layers in the first spaces. Increasing a width of the first spaces may include removing exposed portions of the vertical channel regions in the first spaces.

In some embodiments, forming the first spaces and increasing the height of the first spaces are simultaneously performed, and the increased height of the first spaces is gradually increased from a central portion of the mold stack toward edges of the mold stack.

Removing portions of the sacrificial layers in a first part of the mold stack to form first spaces and to leave portions of the sacrificial layers remaining between the insulation layers in a second part of the mold stack may include exposing sidewalls of the vertical channel regions adjacent the remaining sacrificial layers. Enlarging the first spaces may include removing exposed portions of the vertical channel regions in the first spaces to enlarge the first spaces.

The methods may further include forming a cut defining a region that vertically penetrates at least an uppermost sacrificial layer among the sacrificial layers to divide the at least uppermost sacrificial layer into two separate portions. The methods may further include forming a cut defining a region that vertically penetrates at least an uppermost gate among the gates filling the second spaces to divide the at least uppermost gate into two separate portions.

In some embodiments of the inventive subject matter, a memory device includes vertically-spaced insulation layers stacked on a substrate, vertical channel regions extending through the insulation layers and electrically connected to the substrate and gate electrodes disposed between adjacent ones of the insulation layers surrounding the vertical channel regions. At least one data storage layer is disposed between the gate electrodes and the vertical channel regions. The gate electrodes have a greater thickness at a first location near sidewalls of the insulation layers than at a second location farther away from the sidewalls of the insulation layers.

In some embodiments, the insulation layers may be thinner at the first location than at the second location. The insulation layers may gradually decrease in thickness away from the sidewalls of the insulation layers.

In some embodiments, portions of the vertical channel regions surrounded by the gate electrodes may be narrower than portions of the vertical channel regions surrounded by the insulation layers.

The device may further include an isolation region adjoining the sidewalls of the insulation layers.

In still further embodiments, a method includes forming a mold stack including alternating insulation layers and sacrificial layers on a substrate, forming vertical channel regions extending through the insulation layers and sacrificial layers of the mold stack and forming gate electrodes between adjacent ones of the insulation layers and surrounding the vertical channel regions wherein the gate electrodes have a greater thickness at a first location near sidewalls of the insulation layers than at a second location further away from the sidewalls of the insulation layers. The methods may further include forming at least one data storage layer on the vertical channel regions before forming the gate electrodes and forming gate electrodes may include forming the gate electrodes on the at least one data storage layer. The gate electrodes may decrease in thickness away from the sidewalls of the insulation layers in a stepwise or gradual manner.

BRIEF DESCRIPTION OF THE DRAWINGS

The above and other features and advantages of the disclosure will become more apparent in view of the attached drawings and accompanying detailed description.

DETAILED DESCRIPTION

Figure 1A:
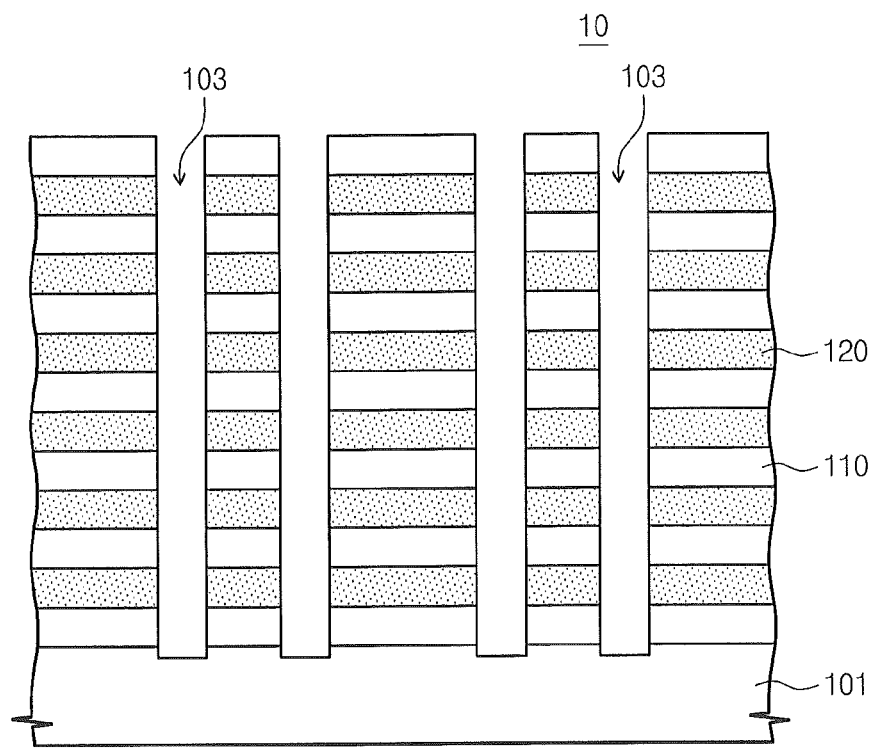
FIGS. 1A to 1J are cross sectional views illustrating a method of fabricating a semiconductor memory device according to some exemplary embodiments.

The inventive subject matter will now be described more fully hereinafter with reference to the accompanying drawings, in which exemplary embodiments of the inventive subject matter are shown. The advantages and features of the inventive subject matter and methods of achieving them will be apparent from the following exemplary embodiments that will be described in more detail with reference to the accompanying drawings. It should be noted, however, that the inventive subject matter is not limited to the following exemplary embodiments, and may be implemented in various forms. In the drawings, the same reference numerals or the same reference designators denote the same elements throughout the specification.

First Embodiments

Figure 1B:
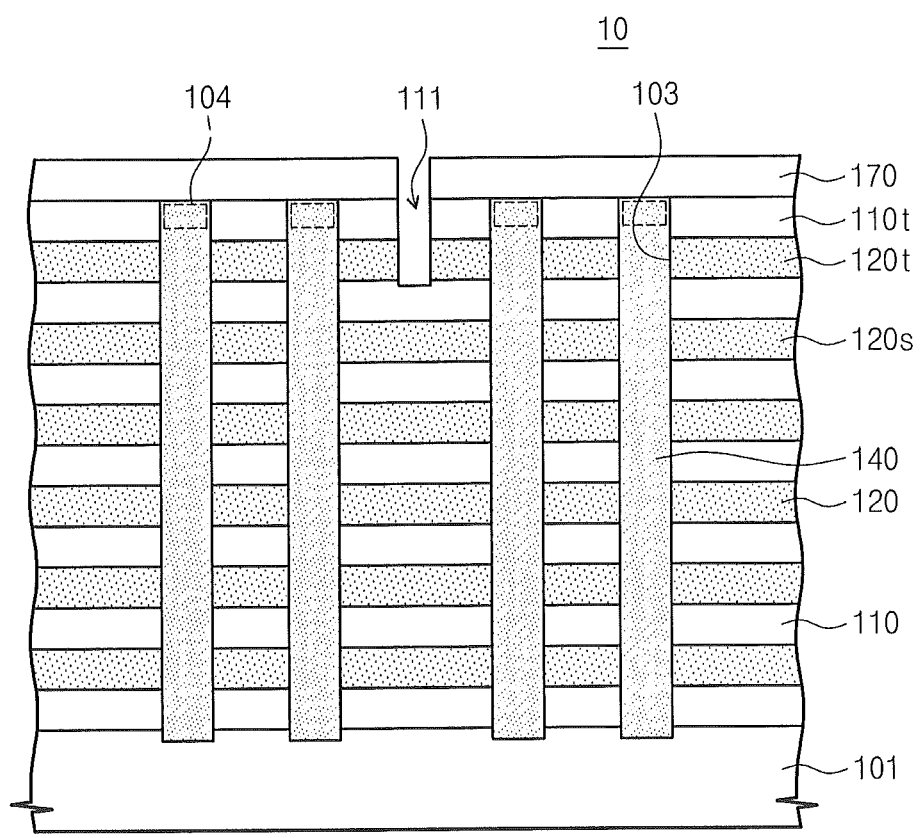
Figure 1C:
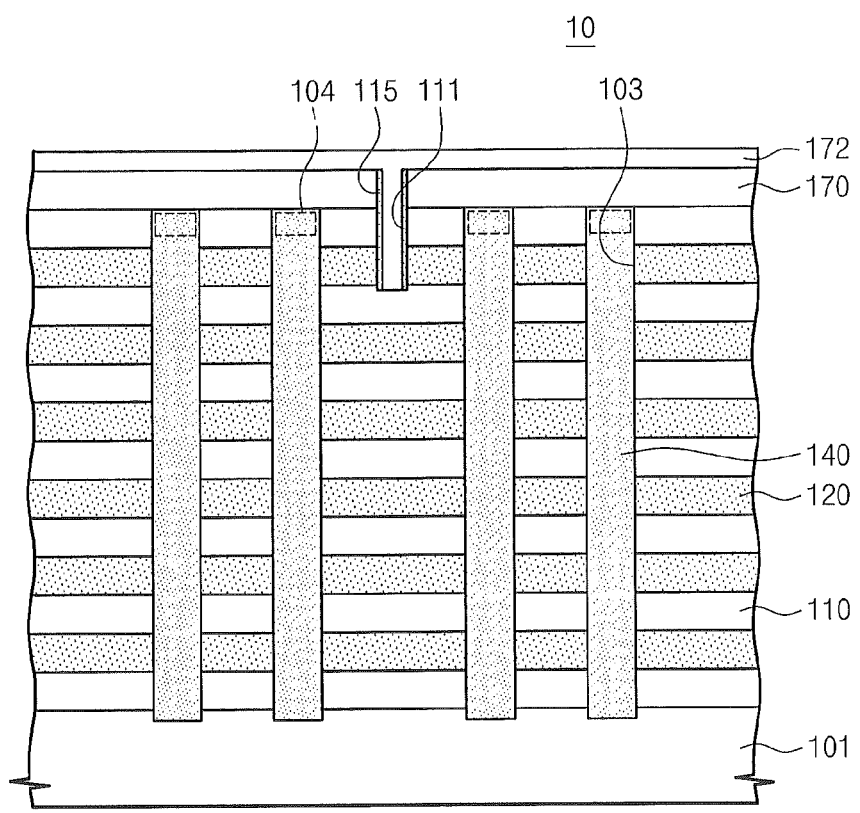
Figure 1D:
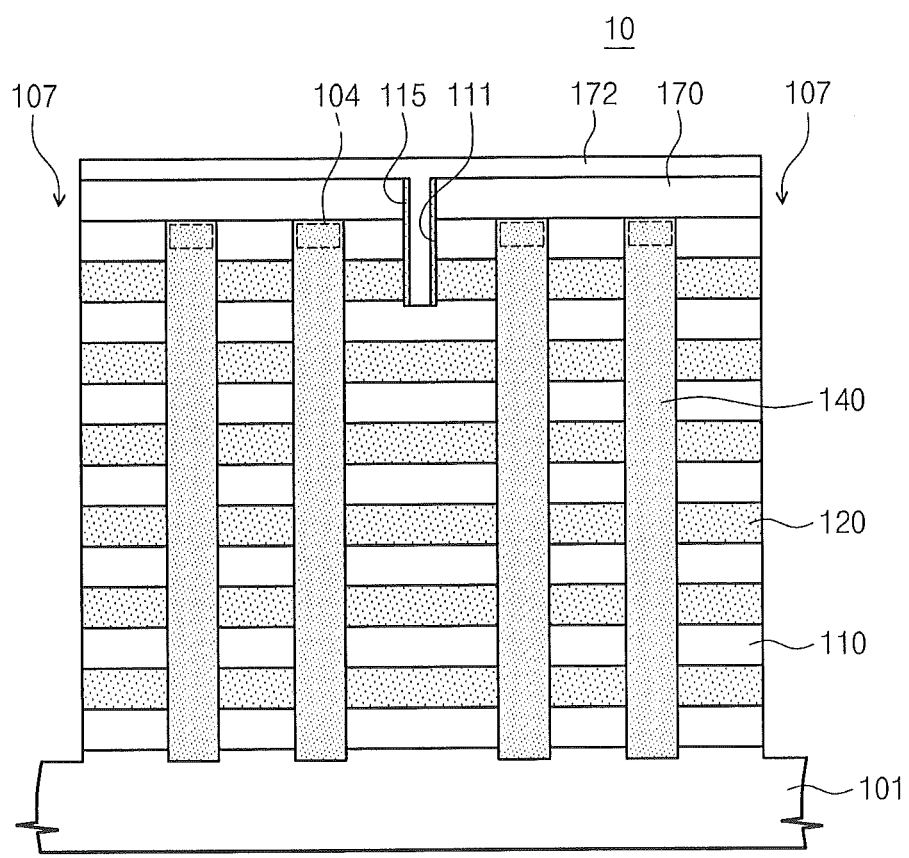
Figure 1E:
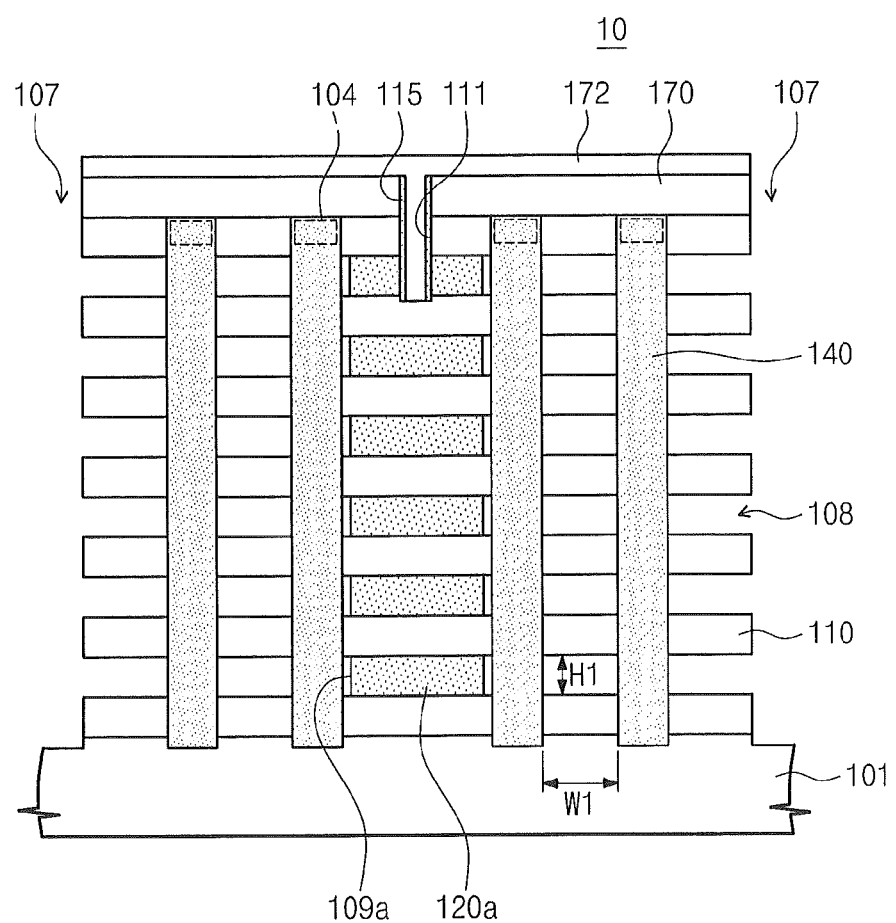
Figure 1F:
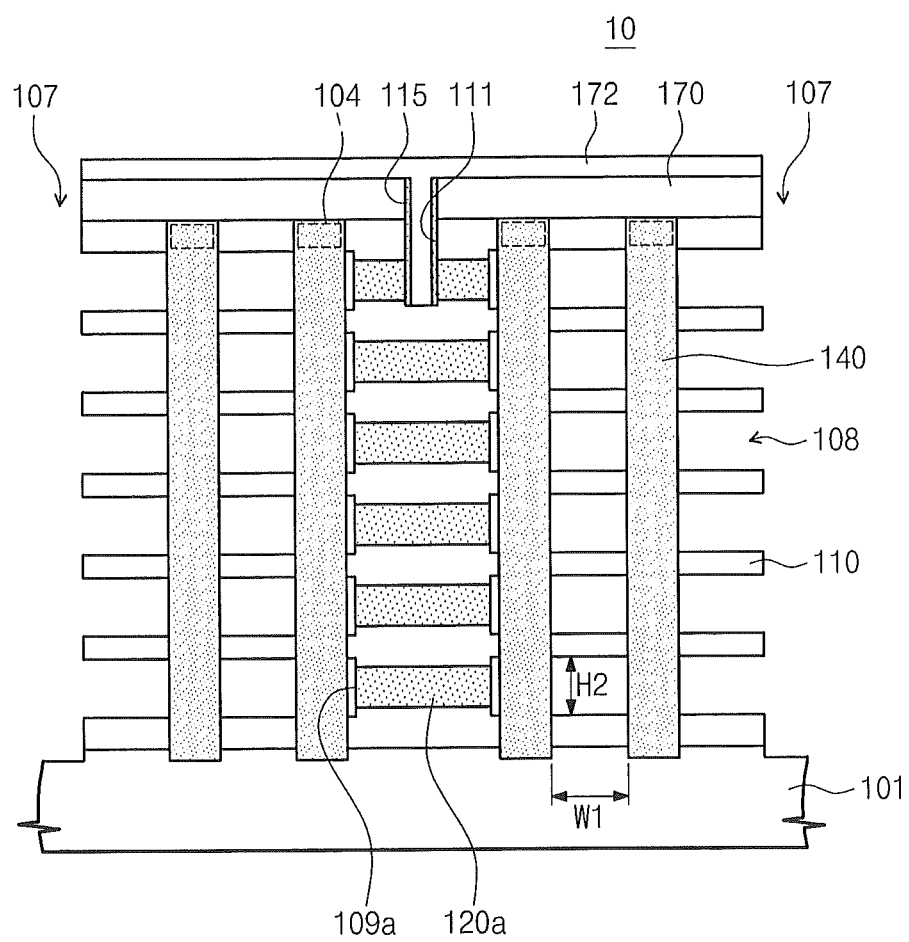
Figure 1G:
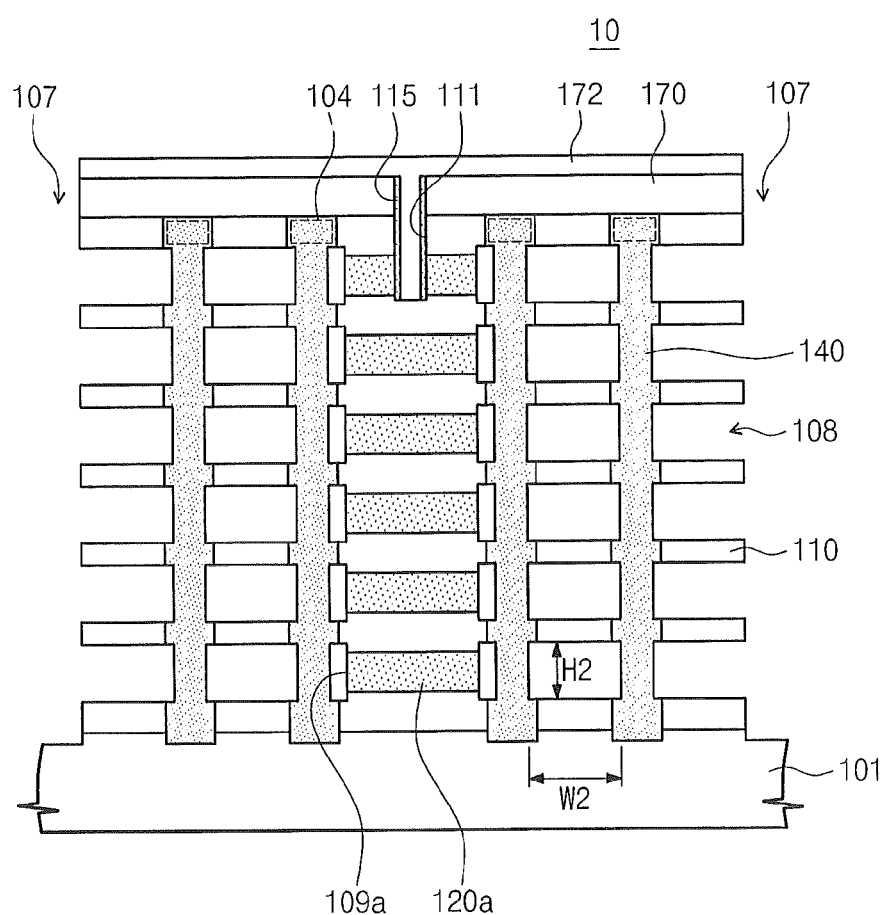
Figure 1H:
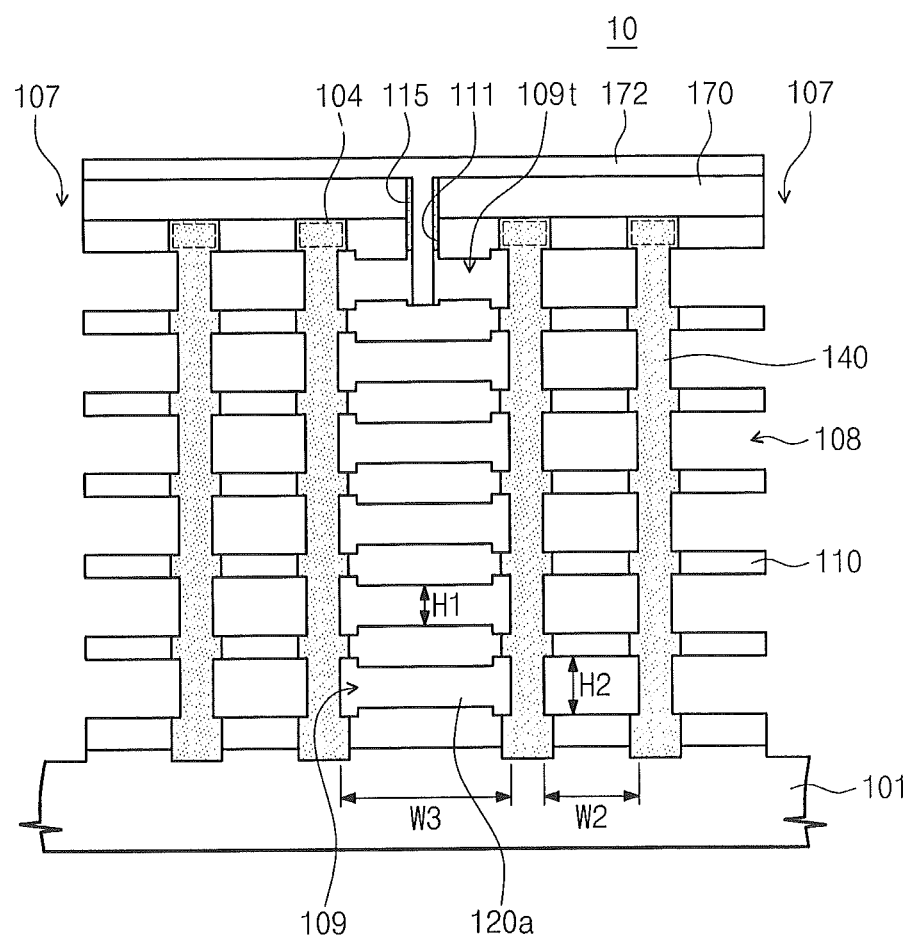
Figure 1I:
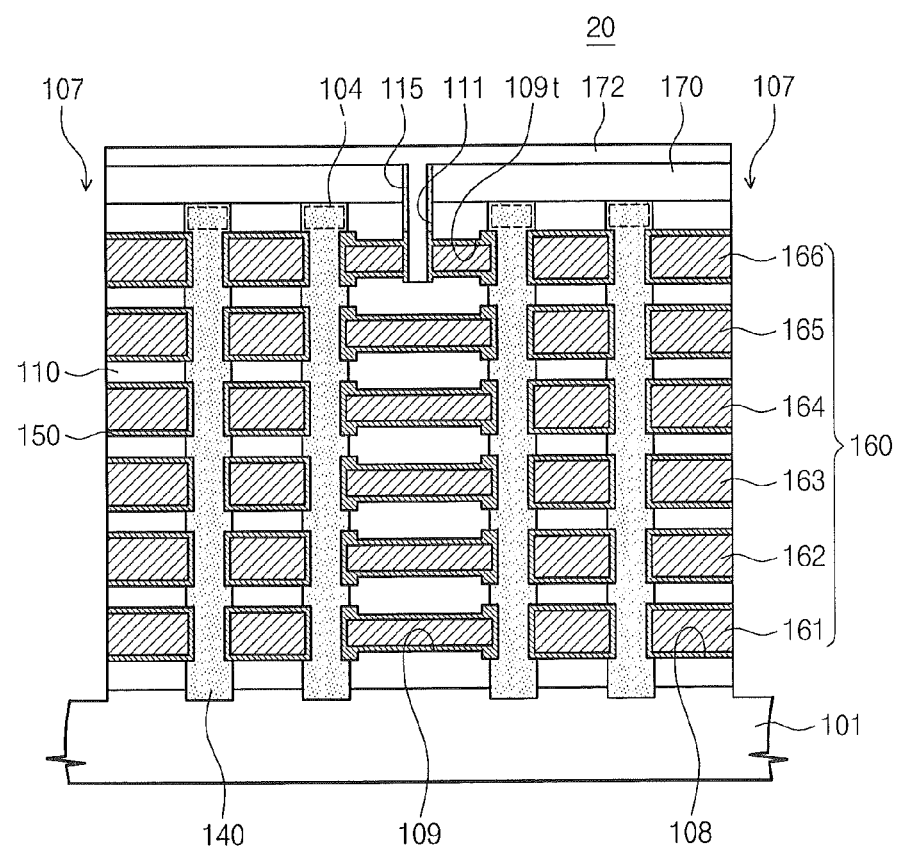
Figure 1J:
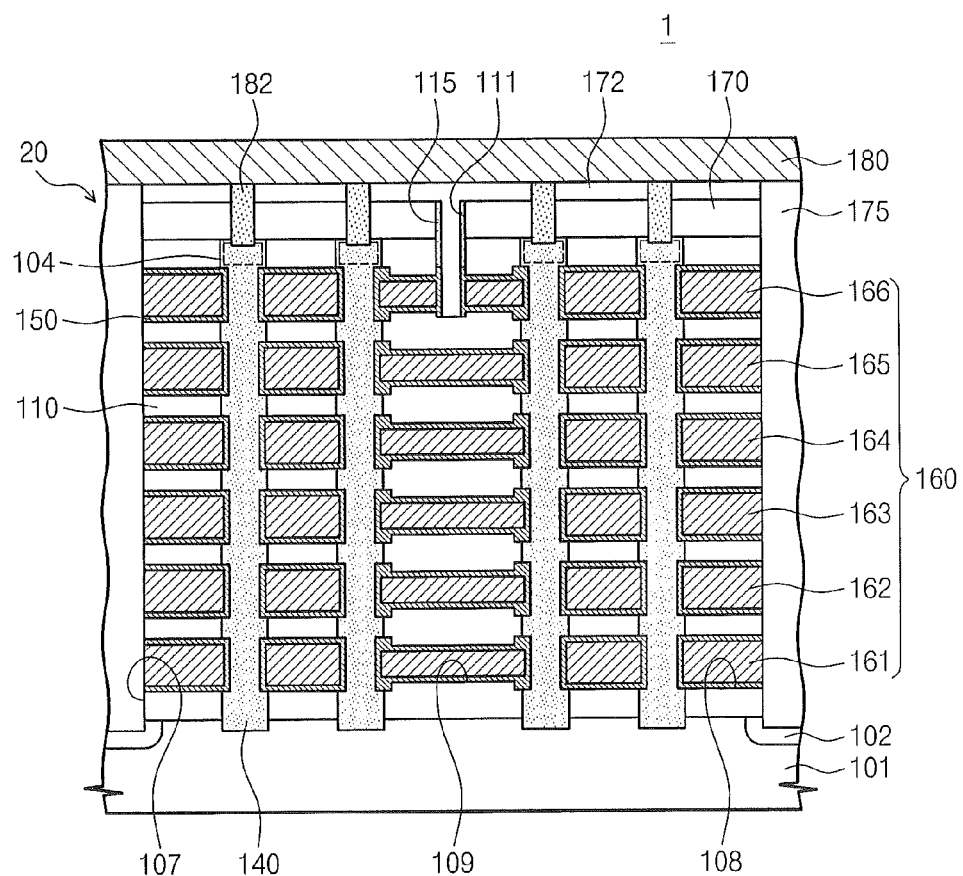
Figure 2A:
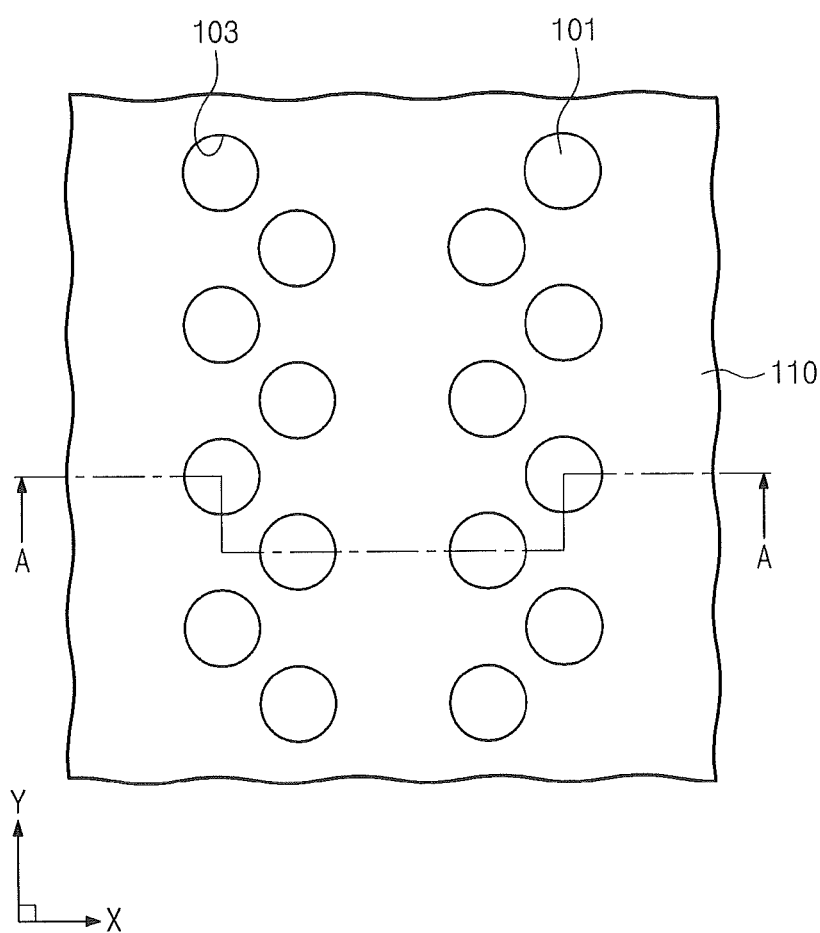
FIG. 2A is a plan view corresponding to the cross sectional view of FIG. 1A.
Figure 2B:
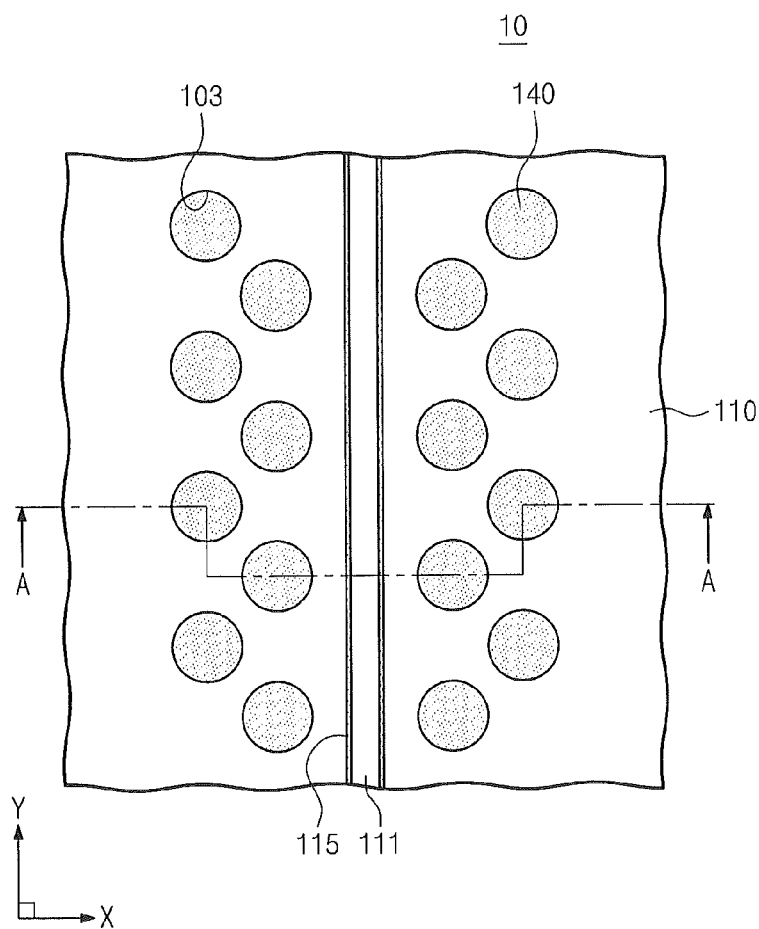
FIG. 2B is a plan view corresponding to the cross sectional view of FIG. 1C.
Figure 2C:
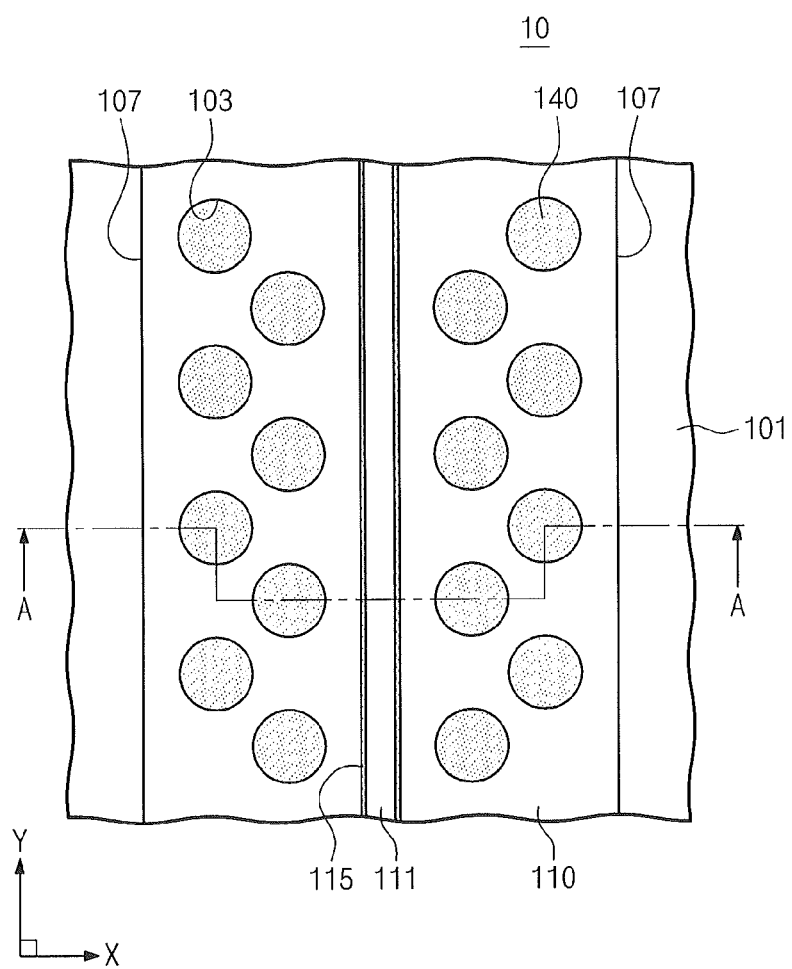
FIG. 2C is a plan view corresponding to the cross sectional view of FIG. 1D.
Figure 2D:
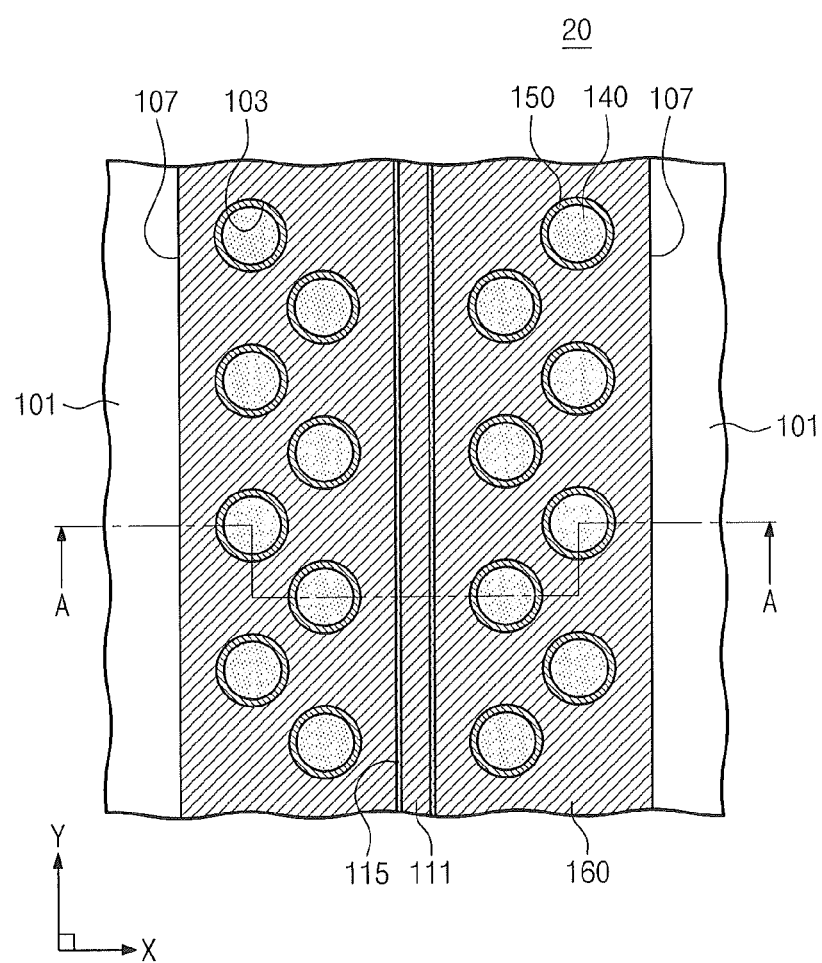
FIG. 2D is a plan view corresponding to the cross sectional view of FIG. 1I.
Figure 2E:
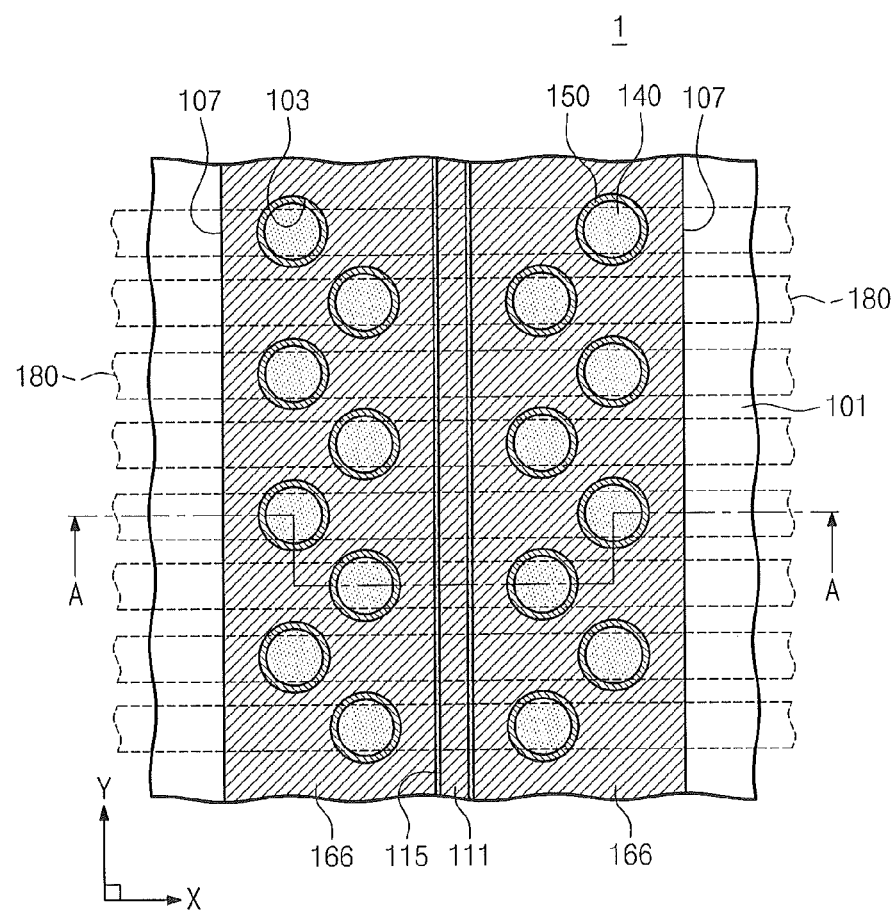
FIG. 2E is a plan view corresponding to the cross sectional view of FIG. 1J.
Figure 2F:
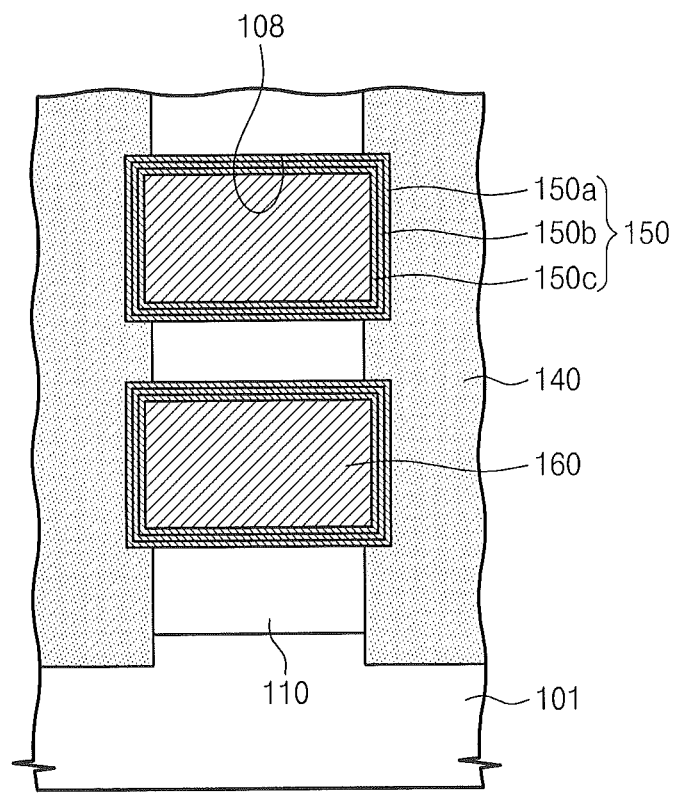
FIG. 2F is an enlarged cross sectional view illustrating a portion of FIG. 1I.

FIGS. 1A to 1J are cross sectional views illustrating a method of fabricating a semiconductor memory device according to some exemplary embodiments. FIG. 2A is a plan view corresponding to the cross sectional view of FIG. 1A, and FIG. 2B is a plan view corresponding to the cross sectional view of FIG. 1C. FIG. 2C is a plan view corresponding to the cross sectional view of FIG. 1D, and FIG. 2D is a plan view corresponding to the cross sectional view of FIG. 1I. Further, FIG. 2E is a plan view corresponding to the cross sectional view of FIG. 1J, and FIG. 2F is an enlarged cross sectional view illustrating a portion of FIG. 1I. FIGS. 1A to 1J are cross sectional views taken along lines A-A of FIGS. 2A to 2E.

Referring to FIG. 1A, a mold stack 10 may be formed on a substrate 101. The substrate 101 may include a semiconductor substrate, for example, a single crystalline silicon wafer. The mold stack 10 may be formed by alternately and repeatedly stacking a plurality of insulation layers 110 and a plurality of sacrificial layers 120. The insulation layers 110 may be formed of a silicon oxide layer or a silicon nitride layer, and the sacrificial layers 120 may be formed of a material layer having an etch selectivity with respect to the insulation layers 110. For example, the sacrificial layers 120 may be formed of one selected from the group consisting of a silicon oxide layer, a silicon nitride layer, a silicon carbide layer, a silicon layer, and a silicon-germanium layer. In an exemplary embodiment, the insulation layers 110 may be a silicon oxide layer and the sacrificial layers 120 may be a silicon nitride layer. The sacrificial layers 120 may have the same thickness. The insulation layers 110 may have the same thickness or different thicknesses.

The mold stack 10 may be patterned to form vertical channel region holes 103. For example, the vertical channel region holes 103 may be formed by etching the mold stack 10 using a dry etching process. Thus, the vertical channel region holes 103 may vertically penetrate the mold stack 10 and may expose the substrate 101. During formation of the vertical channel region holes 103, the substrate 101 may be overetched so that some top surface thereof may be recessed. Each of the vertical channel region holes 103 may have a uniform width or different widths along a vertical direction. For the purpose of ease and convenience in explanation, the following exemplary embodiments will be described hereinafter in conjunction with an example that each of the vertical channel region holes 103 has a substantially uniform width along a vertical direction. However, the exemplary embodiments are not intended to limit that each of the vertical channel region holes 103 has a uniform width along a vertical direction. The vertical channel region holes 103 may be two dimensionally arrayed in rows and columns in a plan view. For example, the vertical channel region holes 103 may be arrayed zigzag fashion along the Y-axis direction, as illustrated in a plan view of FIG. 2A. As another example, the vertical channel region holes 103 may be arrayed zigzag fashion along the X-direction. Alternatively, the vertical channel region holes 103 may be two dimensionally arrayed along straight lines parallel with the X-axis and the Y-axis.

Referring to FIG. 1B, vertical channel regions 140, which are perpendicular to the substrate 101, may be formed. The vertical channel regions 140 may be formed in respective ones of the vertical channel region holes 103. The vertical channel regions 140 may be formed by filling the vertical channel region holes 103 with a single crystalline silicon material or a polysilicon material using a deposition process or an epitaxial growth process. Thus, the vertical channel regions 140 may vertically penetrate the mold stack 10 to contact the substrate 101. The vertical channel regions 140 may be doped with impurities of the same conductivity type as the substrate 101. For example, the vertical channel regions 140 and the substrate 101 may be doped with P-type impurities (e.g., boron ions, aluminum ions, gallium ions or indium ions). The number and position of the vertical channel regions 140 may depend on the number and position of the vertical channel region holes 103. For example, the vertical channel region holes 103 are arrayed zigzag along the Y-axis direction as illustrated in FIG. 2A, the vertical channel regions 140 may also be arrayed zigzag along the Y-axis direction in a plan view. Alternatively, when the vertical channel region holes 103 are two dimensionally arrayed along straight lines parallel with the X-axis and the Y-axis, the vertical channel regions 140 may also be arrayed along the straight lines parallel with the X-axis and the Y-axis in a plan view. Each of the vertical channel regions 140 may be formed to have a bulk configuration such as a pillar having a circle-shaped horizontal sectional view or a pillar having a polygon-shaped horizontal sectional view. N-type impurities, for example (e.g., phosphorus ions, arsenic ions or stibium ions) may be injected into upper portions of the vertical channel regions 140, thereby forming drains 104.

A capping insulation layer 170 may be formed on an uppermost layer 110t of the insulation layers 110 and on the vertical channel regions 140. The capping insulation layer 170 may be formed by depositing an insulation material (e.g., a silicon oxide layer) having an etch selectivity with respect to the sacrificial layers 120. The capping insulation layer 170 and the mold stack 10 may be patterned to form a cut 111. The cut 111 may be formed to fabricate string selection lines 166 as will be described later with reference to FIG. 1J. In the specification, the cut 111 may be referred to as a string selection line (SSL) cut.

The SSL cut 111 may be formed by patterning the capping insulation layer 170, the uppermost insulation layer 110t and the uppermost sacrificial layer 120t. Further, the SSL cut 111 may be formed to have a groove shape extending in the Y-axis direction, as illustrated in FIG. 2B. While the SSL cut 111 is formed, the insulation layer 110 under the uppermost sacrificial layer 120t may be recessed due to an over-etch step. The SSL cut 111 may be formed between two adjacent vertical channel regions 140. Alternatively, the SSL cut 111 may be formed by patterning the capping insulation layer 170, the uppermost insulation layer 110t, the uppermost sacrificial layer 120t under the uppermost insulation layer 110t, the second uppermost insulation layer 110 under the uppermost sacrificial layer 120t, and the second uppermost sacrificial layer 120s under the second uppermost insulation layer 110. In this case, two string selection lines vertically stacked may be formed in each row in a subsequent process.

Referring to FIG. 1C, spacers 115 may be formed on respective ones of sidewalls of the SSL cut 111. Specifically, a layer may be conformally formed to a uniform thickness on an inner surface of the SSL cut 111 and on a top surface of the capping insulation layer 170, and the layer may be anisotropically etched to form the spacers 115. The spacers 115 may be formed of an insulating material having an etch selectivity with respect to the insulation layers 110. For example, the spacers 115 may include a nitride layer, an oxynitride layer, an oxide layer, a low temperature oxide (LTO) layer deposited at a temperature within the range of a room temperature to about 600° C., or a combination thereof. The spacers 115 may extend in the Y-axis direction as illustrated in FIG. 2B.

A non-sacrificial layer 172 may be formed to fill the SSL cut 111 and to cover the capping insulation layer 170. The non-sacrificial layer 172 may be formed of an insulating material having an etch selectivity with respect to the sacrificial layers 120. For example, the non-sacrificial layer 172 may be formed of a high density plasma (HDP) oxide layer and/or a high temperature oxide (HTO) layer.

According to the above descriptions, after the vertical channel regions 140 are formed, the capping insulation layer 170, the SSL cut 111 and the non-sacrificial layer 172 may be sequentially formed. Alternatively, after the capping insulation layer 170, the SSL cut 111 and the non-sacrificial layer 172 are sequentially formed, the vertical channel regions 140 may be formed. In the event that the vertical channel regions 140 are formed after formation of the non-sacrificial layer 172, the vertical channel regions 140 may be formed to further penetrate the capping insulation layer 170 and the non-sacrificial layer 172.

Referring to FIG. 1D, the non-sacrificial layer 172, the capping insulation layer 170 and the mold stack 10 may be patterned to form cuts 107. The cuts 107 may be formed to fabricate gate electrodes 160 constituting word lines 162-165, as will be described later with reference to FIG. 1J. In the specification, the cuts 107 may be referred to as a word line (WL) cut. The WL cuts 107 may be formed by patterning the non-sacrificial layer 172, the capping insulation layer 170 and the mold stack 10 using a dry etching process. Accordingly, the WL cuts 107 may vertically penetrate the mold stack 10 to expose the substrate 101. While the WL cuts 107 are formed, the substrate 101 may be over-etched and may be recessed. In an exemplary embodiment, the vertical channel regions 140 may be disposed between two adjacent WL cuts 107. Thus, a plurality of vertical channel regions 140, for example, four vertical channel regions 140 will be shown in the cross sectional view of FIG. 1D taken along the line A-A of FIG. 2C. The WL cuts 107 may expose sidewalls of the insulation layers 110 and the sacrificial layers 120. The WL cuts 107 may be formed to extend along the Y-axis direction, as illustrated in FIG. 2C.

Referring to FIG. 1E, the sacrificial layers 120 may be partially removed using a first pull-back process. The first pull-back process may be performed using a chemical solution, which is capable of selectively removing the sacrificial layers 120, as an etchant. In the event that the insulation layers 110 are formed of a silicon oxide layer and the sacrificial layers 120 are formed of a silicon nitride layer, the sacrificial layers 120 may be partially removed using a phosphoric acid ($H_3PO_4$) as an etchant. The etchant may be supplied through the WL cuts 107 to partially remove the sacrificial layers 120. The sacrificial layers 120 may be partially removed by adjusting a process condition (e.g., a etch time) of the wet etching process. As a result of the partial wet etching process, edge portions of the sacrificial layers 120 may be removed to form recessed regions 109a and first spaces 108 between the vertically stacked insulation layers 110, and central portions 120a of the sacrificial layers 120 may remain. The recessed regions 109a may expose sidewalls of the vertical channel regions 140 adjacent to the remained sacrificial layers 120a.

Each of the first spaces 108 may have a first width W1 and a first height H1. The first width W1 may correspond to a distance between two adjacent vertical channel regions 140 and the first height H1 may correspond to a distance between two adjacent insulation layers 110 vertically stacked.

Referring to FIG. 1F, the insulation layers 110 may be partially removed using a chemical solution which is capable of selectively etching the insulation layers 110. For example, the insulation layers 110 may be isotropically etched using a pre-cleaning process that employs a hydrofluoric acid (HF) as an etchant. As a result of the pre-cleaning process, each of the first spaces 108 may be vertically enlarged to have a second height H2 which is greater than the first height H1. That is, the vertical thickness of the insulation layers 110 may be reduced by the pre-cleaning process, thereby increasing a distance between the insulation layers 110 vertically stacked. The second height H2 of the first spaces 108 may depend on the amount of the etched insulation layers 110, and the amount of the etched insulation layers 110 may depend on a time for which the pre-cleaning process is performed. The insulation layers 110 exposed by the recessed regions 109a may also be etched during the pre-cleaning process. Thus, each of the recessed regions 109a may have the second height H2 after the pre-cleaning process is performed.

Referring to FIG. 1G, the vertical channel regions 140 may be shrunk using a trimming process. The trimming process may be performed using a dry etching process that exhibits an etch selectivity with respect to the insulation layers 110 and the remained sacrificial layers 120a. For example, when the insulation layers 110 are formed of a silicon oxide layer and the vertical channel regions 140 are formed of a silicon layer, the vertical channel regions 140 may be etched using a process gas including at least one of a chlorine ($Cl_2$) gas and a sulfur hexafluoride ($SF_6$) gas as an etching gas. The trimming process, for example, the dry etching process may etch the vertical channel regions 140 exposed by the first spaces 108. During the trimming process, portions of the vertical channel regions 140 surrounded by the insulation layers 110 may not be etched. Further, portions of the vertical channel regions 140 adjacent to the remained sacrificial layers 120a may also be etched by the etching gas supplied through the recessed regions 109a during the trimming process. Accordingly, the vertical channel regions 140 may be formed such that some portions of the vertical channel regions 140 surrounded by the insulation layers 110 have a width which is greater than that of some portions of the vertical channel regions 140 exposed by the first spaces 108 and the recessed regions 109a. After the vertical channel regions 140 are partially shrunk, the first spaces 108 may be laterally expanded to have a second width W2 which is greater than the first width W1. That is, the trimming process may increase a distance between the sidewalls of the adjacent vertical channel regions 140 exposed by the first spaces 108 as well as a distance between the WL cuts 107 and the exposed sidewalls of the vertical channel regions 140. Consequently, the pre-cleaning process may increase the height (vertical width) of the first spaces 108 and the trimming process may increase the width (horizontal width) of the first spaces 108. Hence, the pre-cleaning process and the trimming process may increase a volume of each of the first spaces 108.

Referring to FIG. 1H, the remained sacrificial layers 120a may be removed using a second pull-back process. The second pull-back process may be performed using the same or similar manners as the first pull-back process. For example, the remained sacrificial layers 120a may be removed using a wet etching process that employs a chemical solution including a phosphoric acid as an etchant. As a result of the second pull-back process, second spaces 109 having the first height H1 may be formed in the central portion of the mold stack 10. Both edges of the respective second spaces 109 may have a height which is greater than the first height H1. Finally, the plurality of insulation layers 110 may be vertically stacked, and the edges of the insulation layers 110 adjacent to the WL cuts 107 may be thinner than the central portions of the insulation layers 110. In other words, the height (e.g., the second height H2) of the first spaces 108 adjacent to the WL cuts 107 may be greater than the height (e.g., the first height H1) of the second spaces 109 in the central portion of the mold stack 10. The second spaces 109 may be laterally enlarged to have a third width W3 during the trimming process described above. The third width W3 may be equal to or greater than the second width W2.

During removal of the remained sacrificial layers 120a, the spacers 115 may be partially removed. The non-sacrificial layer 172 may have an etch selectivity with respect to the spacers 115 and/or the remained sacrificial layers 120a, as described above Thus, the non-sacrificial layer 172 may not be removed while the remained sacrificial layers 120a are removed. The non-sacrificial layer 172 filling the SSL cut 111 may divide the uppermost second space 109t into two separate portions.

Referring to FIG. 1I, a data storage layer 150 may be conformally formed to cover inner surfaces of the first and second spaces 108 and 109. Gate electrodes 160 may be then formed to fill the first and second spaces 108 and 109 and to surround the vertical channel regions 140. As such, the gate electrodes 160 may be vertically stacked to constitute a gate stack 20, and the gate electrodes 160 may be spaced apart from each other by the insulation layers 110. Accordingly, the vertical channel regions 140 may penetrate the gate stack 20 and may contact the substrate 101. As illustrated in FIG. 2D, the data storage layer 150 may be formed to surround the vertical channel regions 140 and each of the gate electrodes 160 may be formed to have a plate shape extending in the Y-axis direction. As illustrated in FIG. 2F, the data storage layer 150 may be formed to include a tunnel insulation layer 150a adjacent to the vertical channel regions 140, a blocking insulation layer 150c adjacent to the gate stack 20, and a trap insulation layer 150b disposed between the tunnel insulation layer 150a and the blocking insulation layer 150c. The tunnel insulation layer 150a may include a silicon oxide layer, and the trap insulation layer 150b may include a silicon nitride layer. Further, the blocking insulation layer 150c may include a silicon oxide layer and/or an aluminum oxide layer.

The gate stack 20 may be formed of a polysilicon layer, a metal layer, a metal nitride layer, a metal silicide layer or a combination thereof. In an exemplary embodiment, it may be assumed that the gate electrodes 160 are formed of a tungsten layer. To form the tungsten layer, a tungsten hexafluoride ($WF_6$) gas may be supplied into the first and second spaces 108 and 109 through the WL cuts 107. In the event that openings of the first spaces 108 adjacent to the WL cuts 107 are relatively small, the tungsten hexafluoride ($WF_6$) gas may not be harmoniously and/or smoothly flowed into the first spaces 108. Thus, the tungsten layer may be unstably deposited in the first spaces 108 to cause voids in the gate electrodes 160. Further, the second spaces 109 may be located to be farther from the WL cuts 107. Thus, the tungsten hexafluoride ($WF_6$) gas may be more unstably supplied into the second spaces 109. Accordingly, the probability that voids are formed in the gate electrodes 160 in the second spaces 109 may be more increased.

The voids formed in the gate electrodes 160 may be filled with byproduct (e.g., a hydrofluoric gas) generated during deposition of the tungsten layer. The hydrofluoric gas may damage or dissolve insulation layers (e.g., the data storage layer 105) adjacent to the voids in a subsequent high temperature process and/or in a subsequent wet etching process, thereby causing process defects. According to the exemplary embodiments, the second spaces 109 may be formed to have inlet openings which is less than those of the first spaces 108 as illustrated in FIG. 1H, and the first spaces 108 may be formed to have enlarged inlet openings which is greater than the inlet openings of the second spaces 109 as illustrated in FIG. 1G. Thus, the deposition process gas, for example, the tungsten hexafluoride ($WF_6$) gas may be harmoniously and/or smoothly flowed into the first spaces 108 and the second spaces 109. Consequently, the configuration of the first and second spaces 108 and 109 may prevent or minimize generation of the voids in the gate electrodes 160. In the present exemplary embodiment, the gate electrodes 160 may include six gate electrodes 161-166. Each of the gate electrodes 161-166 may further include a titanium nitride (TiN) layer surrounding the tungsten layer. Hereinafter, the gate electrodes 161, 162, 163, 164, 165 and 166 may be referred to as first to sixth gate electrodes, respectively. According to the exemplary embodiments, the sixth gate electrode 166 (e.g., a string selection line) filling the uppermost second space 109t may be divided into two separate portions by the SSL cut 111. Thus, even though the gate electrodes 161-166 including the sixth gate electrode 166 are formed of a metal layer, a process for patterning or etching the sixth gate electrode 166 may not be required.

Referring to FIG. 1J, impurities are injected into the substrate 101 through the WL cuts 107, thereby forming common sources 102. The common sources 102 may be formed to have a different conductivity type from the substrate 101. For example, when the substrate 101 is doped with P-type impurities, the common sources 102 may be doped with N-type impurities. An insulation layer (e.g., a silicon oxide layer) may be then deposited to fill the WL cuts 107, thereby forming isolation layers 175 that separate adjacent gate stacks from each other. Plugs 182 may be formed to penetrate the non-sacrificial layer 172 and the capping insulation layer 170. The plugs 182 may be electrically connected to respective ones of the vertical channel regions 140. Bit lines 180 may be then formed on the non-sacrificial layer 172. The bit lines 180 may be electrically connected to the vertical channel regions 140 through the plugs 182. As such, a three dimensional semiconductor memory device 1, for example, a vertical NAND-type flash memory device may be formed using the processes described above.

The bit lines 180 may be electrically connected to the vertical channel regions 140, as illustrated in FIG. 2E. For example, the vertical channel regions 140 arrayed on a straight line parallel with the X-axis direction may be electrically connected to any one among the bit lines 180 that extend in the X-axis direction. As illustrated in FIG. 1J, the first gate electrode 161 may correspond to a lower selection line (e.g., a ground selection line) that acts as a non word line. The second to fifth gate electrodes 162-165 may correspond to word lines electrically connected to memory cell transistors. The sixth gate electrode 166 may correspond to an uppermost selection line (e.g., a string selection line) that acts as a non word line.

Second Embodiments

Hereinafter, for the purpose of simplification in explanation, descriptions to the same components as illustrated in the first embodiment will be omitted or briefly mentioned.

FIGS. 3A to 3D are cross sectional views illustrating a method of fabricating a semiconductor memory device according to some exemplary embodiments.

Figure 3A:
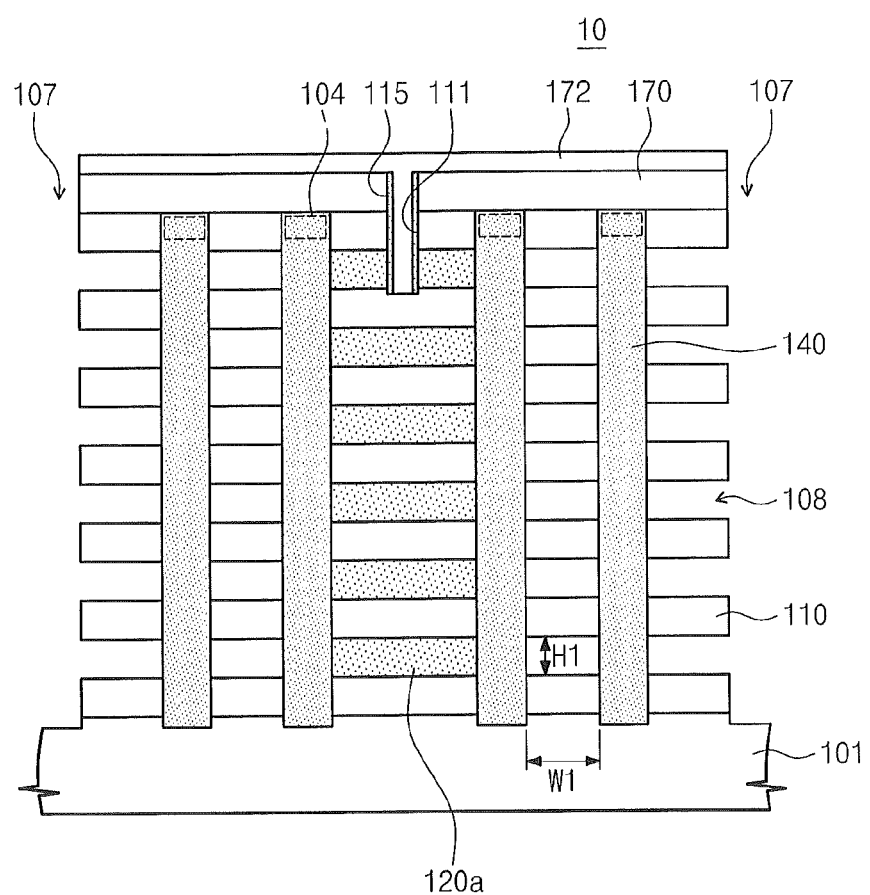
FIGS. 3A to 3D are cross sectional views illustrating a method of fabricating a semiconductor memory device according to some exemplary embodiments.

Referring to FIG. 3A, insulation layers 110 vertically stacked, vertical channel regions 140 penetrating the insulation layers 110, and a mold stack 10 including an SSL cut 111 may be formed on a substrate 101. The insulation layers 110 may be formed using the same or similar manners as described in the first embodiment. That is, the insulation layers 110 may be spaced apart from each other by first spaces 108 and remained sacrificial layers 120a, and the first spaces 108 and the remained sacrificial layers 120a may be formed using a first pull-back process that employs a chemical solution (e.g., a phosphoric acid) supplied through word line (WL) cuts 107 as an etchant. Each of the first spaces 108 may be formed to have a first width W1 and a first height H1. Recessed regions like 109a of FIG. 1E may not be formed between the vertical channel regions 140 and the remained sacrificial layers 120a.

Figure 3B:
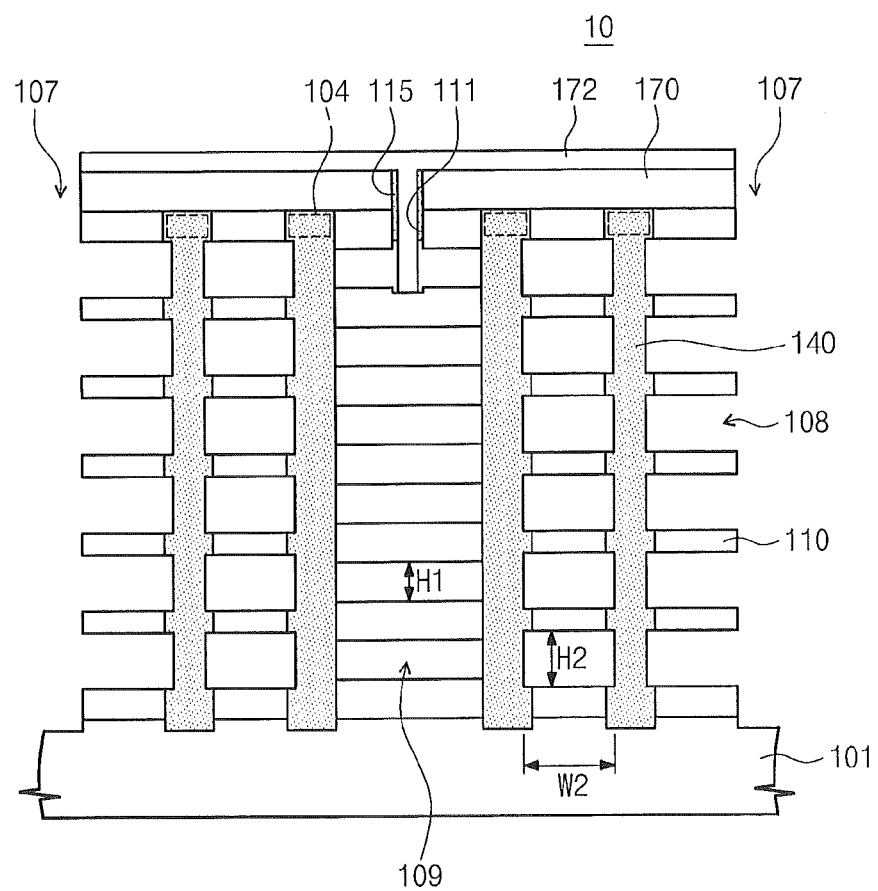

Referring to FIG. 3B, the insulation layers 110 may be isotropically etched using a pre-cleaning process. Portions of spacers 115 on sidewalls of the SSL cut 111 and the remained sacrificial layers 120a may be removed using a second pull-back process. The vertical channel regions 140 may be etched using a trimming process, thereby laterally enlarging the first spaces 108. As a result of the trimming process, each of the first spaces 108 may have a second width W2 which is greater than the first width W1. Second spaces 109 may be formed by removing the remained sacrificial layers 120a. Thus, each of the second spaces 109 may have the first height H1. According to the present exemplary embodiment, the pre-cleaning process and the trimming process may increase the height and the width of the first spaces 108. Further, the vertical channel regions 140 (e.g., outer vertical channel regions) adjacent to the WL cuts 107 may be formed such that some portions of the vertical channel regions 140 surrounded by the insulation layers 110 have a width which is greater than that of some portions of the vertical channel regions 140 exposed by the first spaces 108. Each of the vertical channel regions 140 (e.g., inner vertical channel regions) adjacent to a central portion of the mold stack 10 may be formed to include an uneven sidewall adjacent to the first spaces 108 and a flat sidewall adjacent to the second spaces 109.

Figure 3C:
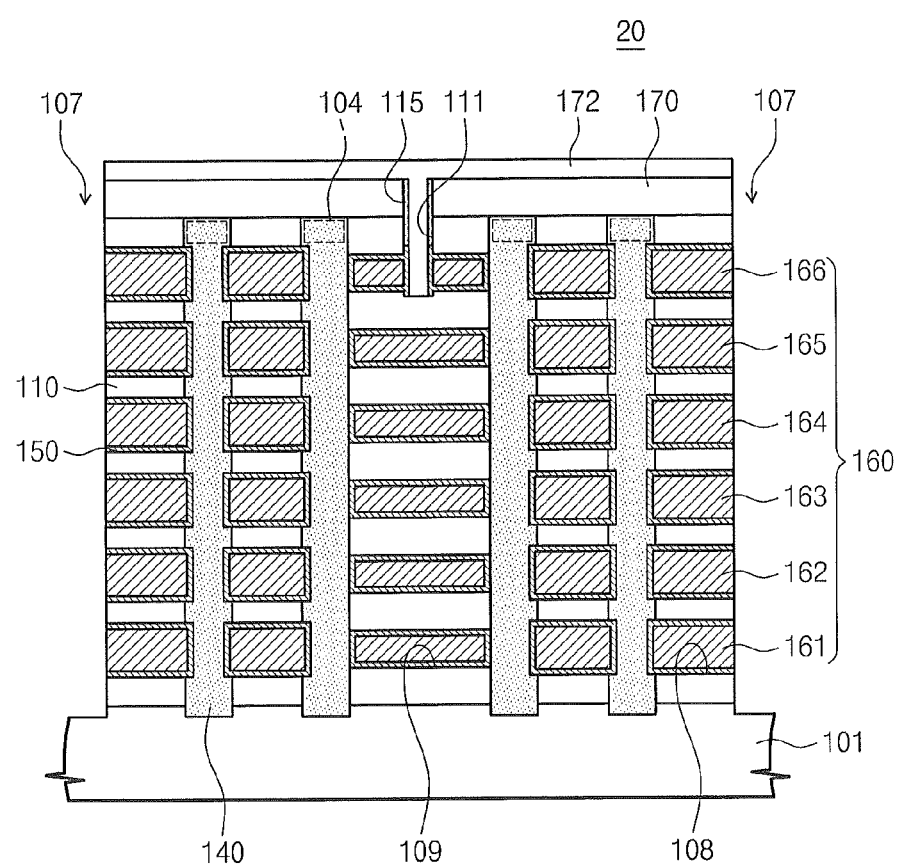

Referring to FIG. 3C, a data storage layer 150 may be conformally formed to cover inner surfaces of the first and second spaces 108 and 109. Gate electrodes 160 may be formed to fill the first and second spaces 108 and 109. The gate electrodes 160 may constitute a gate stack 20. According to the present exemplary embodiment, the height of the first spaces 108 may be greater than the height of the second spaces 109. Thus, a deposition process gas, for example, a tungsten hexafluoride ($WF_6$) gas for forming the gate electrodes 160 may be harmoniously and/or smoothly flowed into the first spaces 108 and the second spaces 109. Consequently, the configuration of the first and second spaces 108 and 109 may prevent or suppress formation of voids in the gate electrodes 160. The gate electrodes 160 filling the second spaces 109 may be thinner than the gate electrodes 160 filling the first spaces 108. The sixth gate electrode 166 may be divided into two separate portions by the SSL cut 111.

Figure 3D:
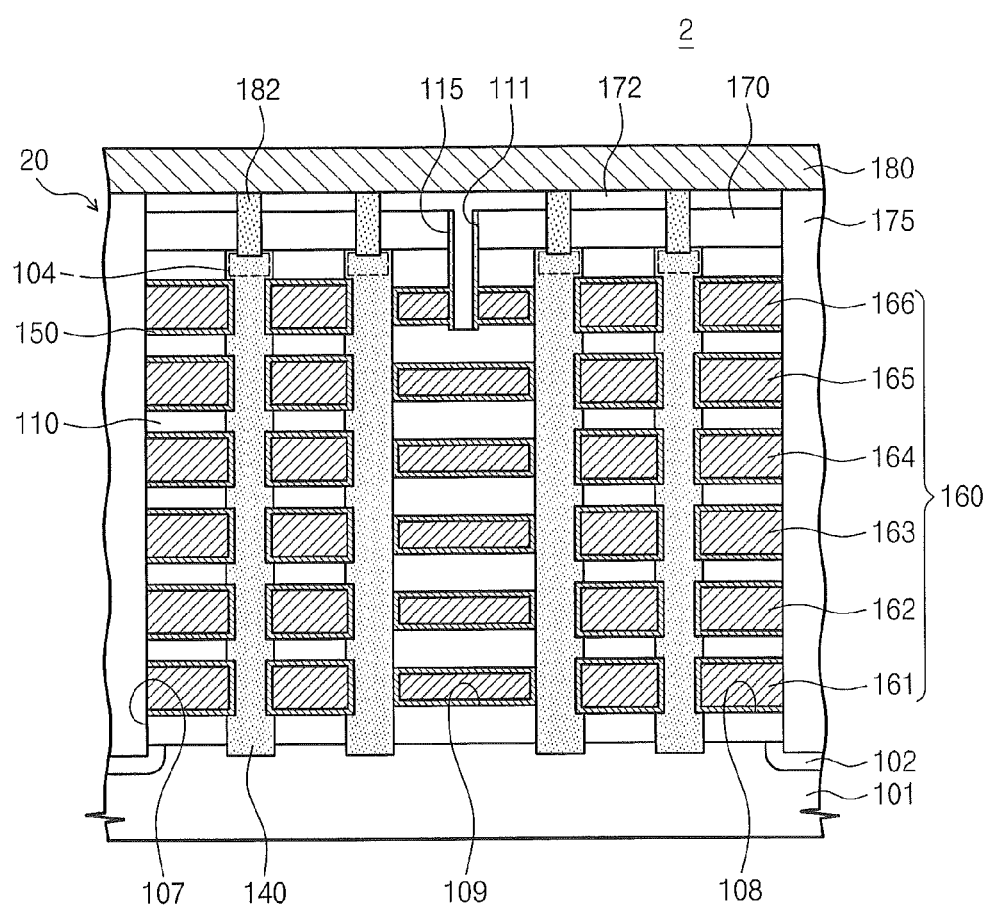

Referring to FIG. 3D, isolation layers 175 may be formed in the WL cuts 107. Before the formation of the isolation layers 175, impurities may be injected into the substrate 101 through the WL cuts 107 to form common sources 102. The common sources 102 may be formed to have an opposite conductivity type to the substrate 101. Bit lines 180 may be formed to cross over the gate stack 20. The bit lines 180 may be electrically connected to the vertical channel regions 140 through plugs 182 that penetrate a capping insulation layer 170 and a non-sacrificial layer 172. As such, a semiconductor memory device 2 may be formed.

Third Embodiments

FIGS. 4A to 4D are cross sectional views illustrating a method of fabricating a semiconductor memory device according to some exemplary embodiments.

Figure 4A:
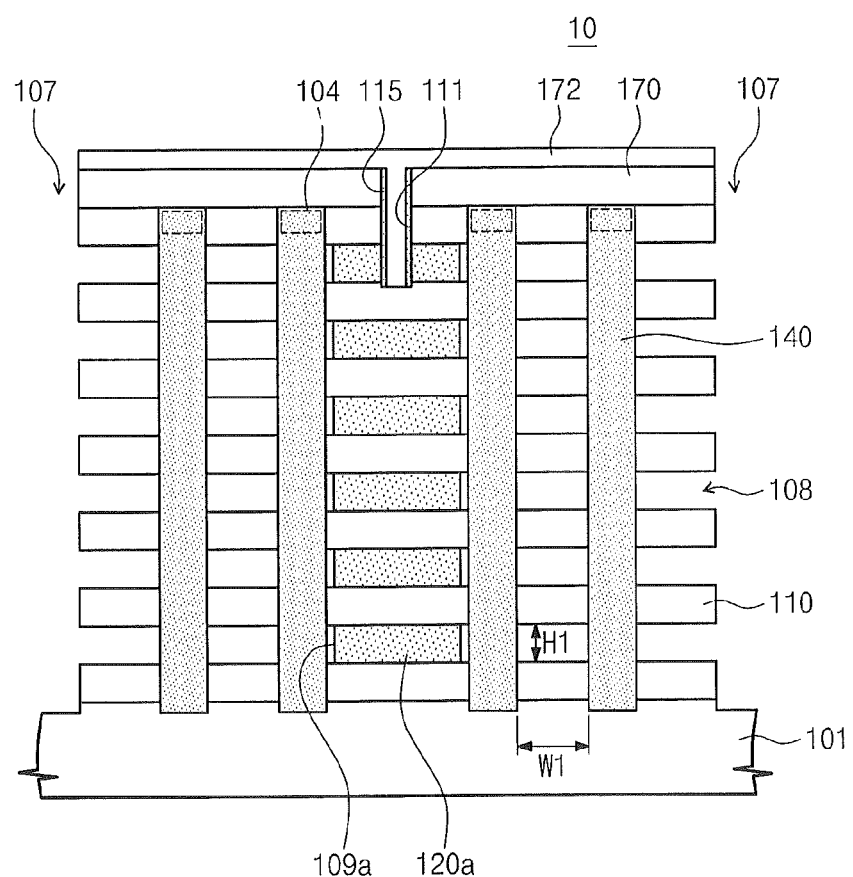
FIGS. 4A to 4D are cross sectional views illustrating a method of fabricating a semiconductor memory device according to some exemplary embodiments.

Referring to FIG. 4A, insulation layers 110 vertically stacked, vertical channel regions 140 penetrating the insulation layers 110, and a mold stack 10 including an SSL cut 111 may be formed on a substrate 101. The insulation layers 110 may be formed using the same or similar manners as described in the first embodiment. That is, the insulation layers 110 may be spaced apart from each other by first spaces 108 and remained sacrificial layers 120a, and the first spaces 108 and the remained sacrificial layers 120a may be formed using a first pull-back process that employs a chemical solution (e.g., a phosphoric acid) supplied through word line (WL) cuts 107 as an etchant. Each of the first spaces 108 may be formed to have a first width W1 and a first height H1. While the first pull-back process is performed, the remained sacrificial layers 120a may be further etched to form recessed regions 109a. The recessed regions 109a may be formed to expose sidewalls of the vertical channel regions 140 adjacent to the remained sacrificial layers 120a. Alternatively, the recessed regions 109a may not be formed between the vertical channel regions 140 and the remained sacrificial layers 120a.

Figure 4B:
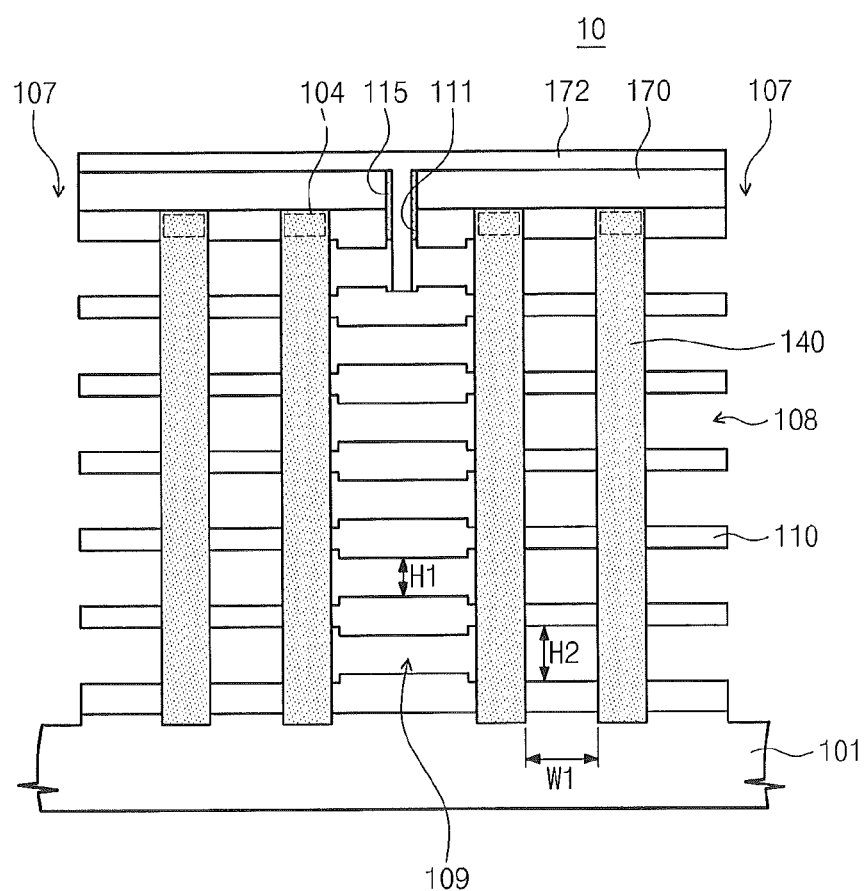

Referring to FIG. 4B, the insulation layers 110 may be isotropically etched using a pre-cleaning process, thereby increasing the first height H1 of the first spaces 108. That is, the first spaces 108 may be vertically enlarged by the pre-cleaning process, thereby having a second height H2 which is greater than the first height H1. Portions of spacers 115 on sidewalls of the SSL cut 111 and the remained sacrificial layers 120a may be removed using a second pull-back process. Second spaces 109 may be formed by removing the remained sacrificial layers 120a. Both edges of the respective second spaces 109 may have a height which is greater than the first height H1. According to the present exemplary embodiment, a trimming process for etching the vertical channel regions 140 exposed by the spaces 108 and 109 may be omitted. Thus, each of the vertical channel regions 140 may have a flat sidewall.

Figure 4C:
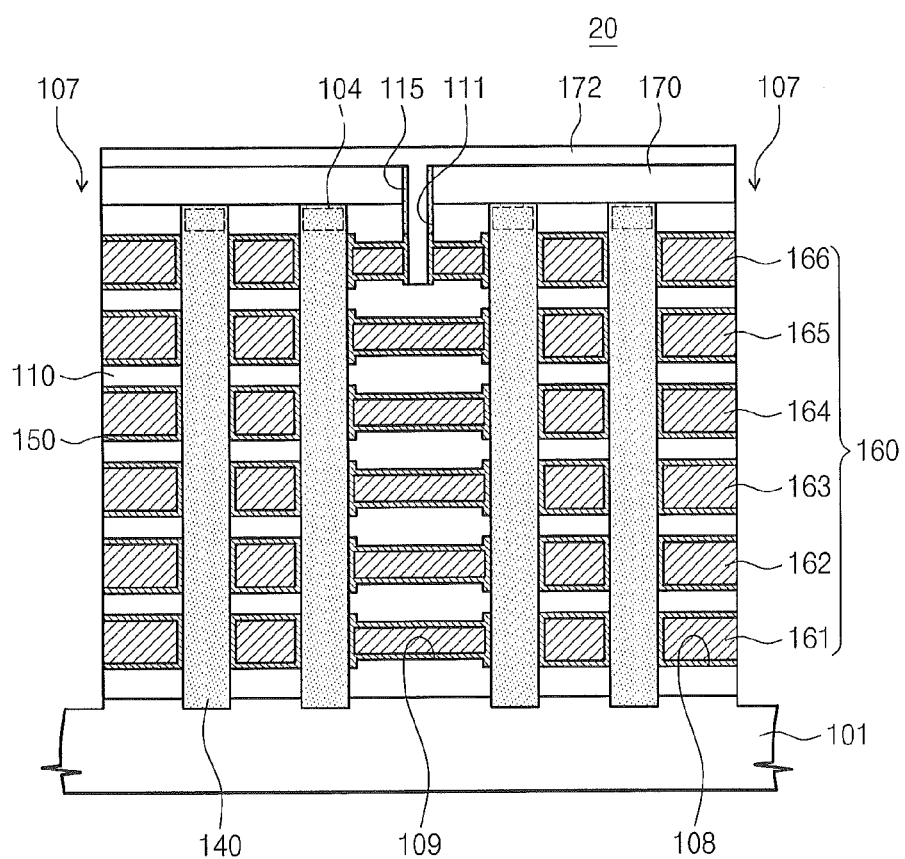

Referring to FIG. 4C, a data storage layer 150 may be conformally formed to cover inner surfaces of the first and second spaces 108 and 109. Gate electrodes 160 may be then formed to fill the first and second spaces 108 and 109. The gate electrodes 160 may constitute a gate stack 20. According to the present exemplary embodiment, the height of the first spaces 108 may be greater than the height of the second spaces 109. Thus, a deposition process gas, for example, a tungsten hexafluoride ($WF_6$) gas for forming the gate electrodes 160 may be harmoniously and/or smoothly flowed into the first spaces 108 and the second spaces 109. Consequently, the configuration of the first and second spaces 108 and 109 may prevent or suppress formation of voids in the gate electrodes 160. The gate electrodes 160 filling the second spaces 109 may be thinner than the gate electrodes 160 filling the first spaces 108. The sixth gate electrode 166 may be divided into two separate portions by the SSL cut 111.

Figure 4D:
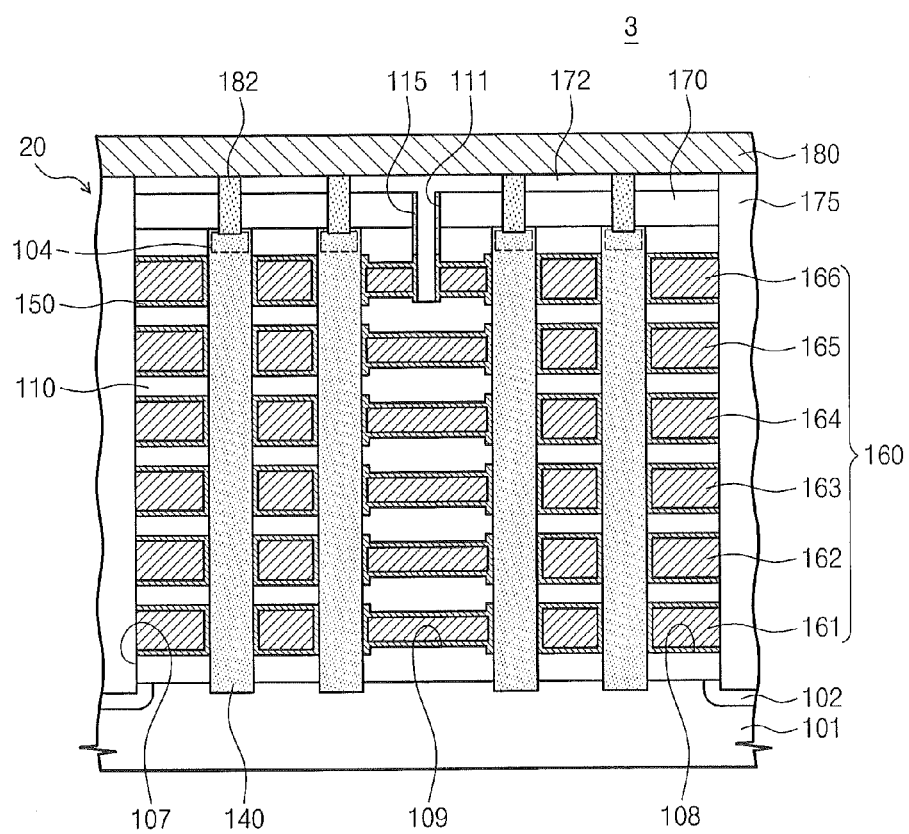

Referring to FIG. 4D, common sources 102, isolation layers 175, plugs 182 and bit lines 180 may be formed to complete a semiconductor memory device 3.

Fourth Embodiments

Figure 5A:
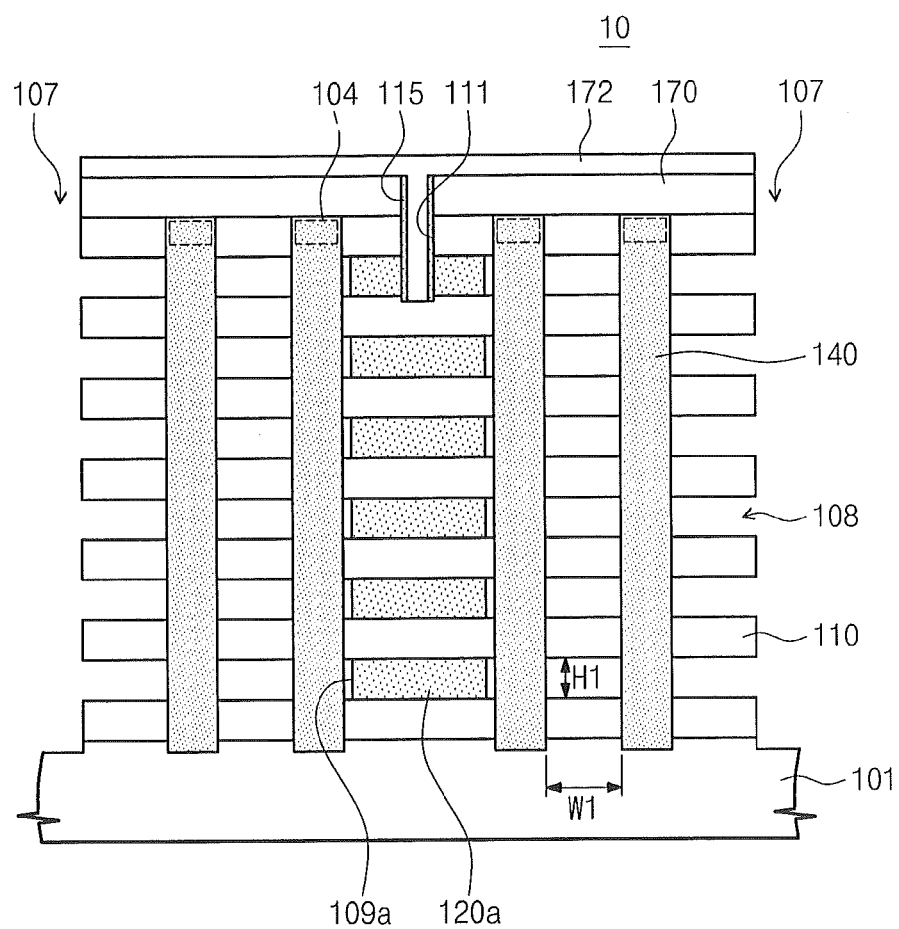
FIGS. 5A to 5D are cross sectional views illustrating a method of fabricating a semiconductor memory device according to some exemplary embodiments.
Figure 5B:
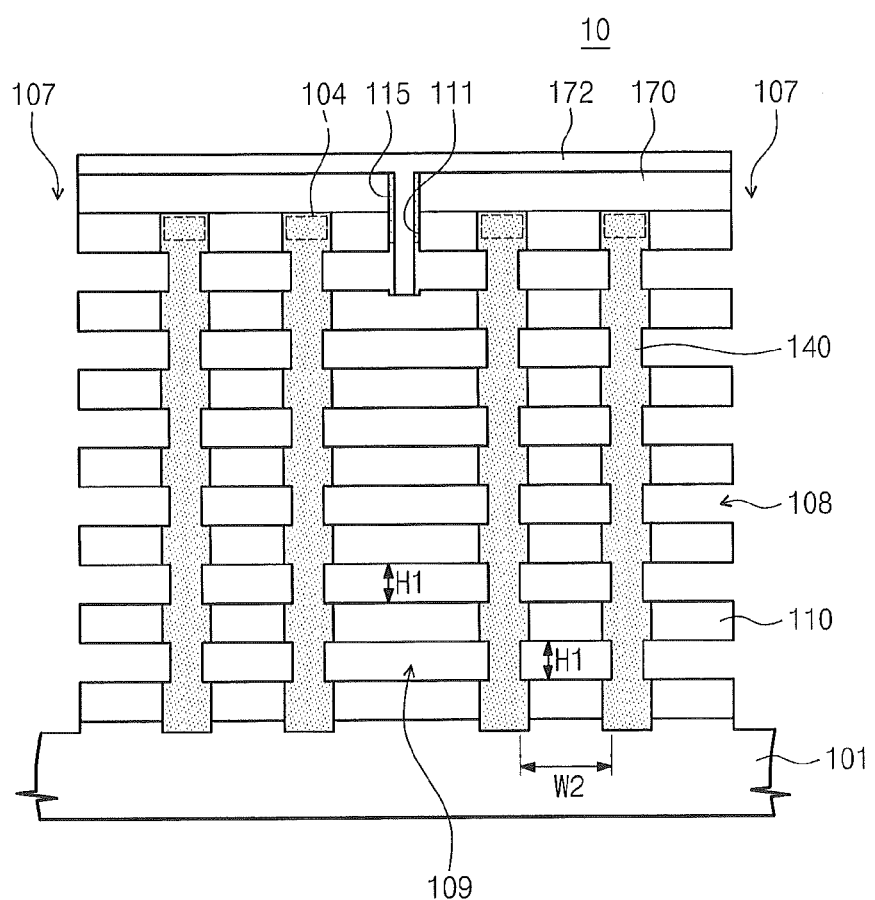
Figure 5C:
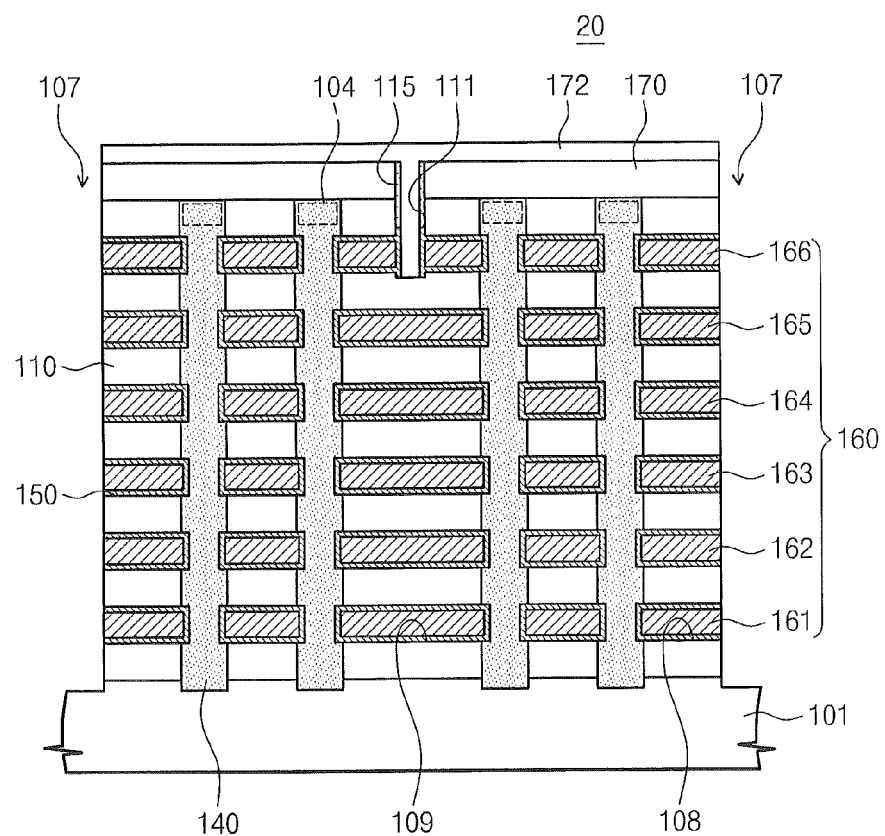
Figure 5D:
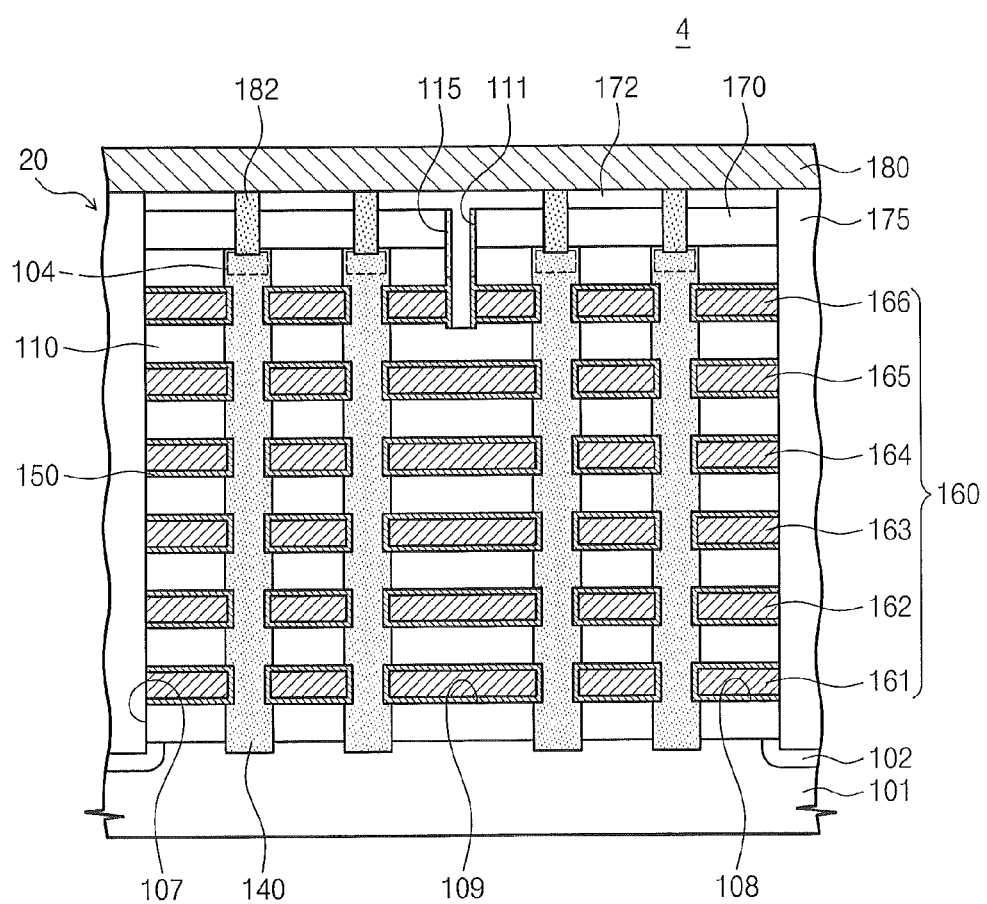
Figure 5E:
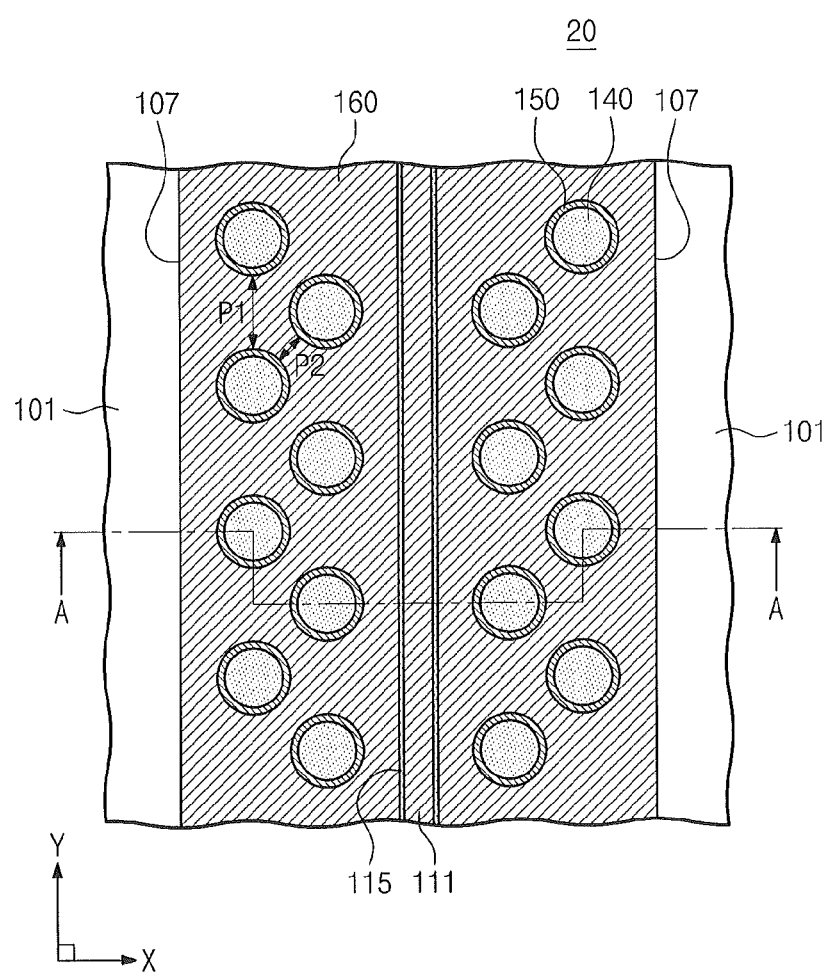
FIG. 5E is a plan view corresponding to the cross sectional view of FIG. 5C.

FIGS. 5A to 5D are cross sectional views illustrating a method of fabricating a semiconductor memory device according to some exemplary embodiments, and FIG. 5E is a plan view relating to the cross sectional view of FIG. 5C. FIG. 5C is a cross sectional view taken along a line A-A of FIG. 5E.

Referring to FIG. 5A, insulation layers 110 vertically stacked, vertical channel regions 140 penetrating the insulation layers 110, and a mold stack 10 including an SSL cut 111 may be formed on a substrate 101. The insulation layers 110 may be formed using the same or similar manners as described in the first embodiment. That is, the insulation layers 110 may be spaced apart from each other by first spaces 108 and remained sacrificial layers 120a, and the first spaces 108 and the remained sacrificial layers 120a may be formed using a first pull-back process that employs a chemical solution (e.g., a phosphoric acid) supplied through word line (WL) cuts 107 as an etchant. Each of the first spaces 108 may be formed to have a first width W1 and a first height H1. While the first pull-back process is performed, the remained sacrificial layers 120a may be further etched to form recessed regions 109a. The recessed regions 109a may be formed to expose sidewalls of the vertical channel regions 140 adjacent to the remained sacrificial layers 120a. Alternatively, the recessed regions 109a may not be formed between the vertical channel regions 140 and the remained sacrificial layers 120a.

Referring to FIG. 5B, the vertical channel regions 140 may be etched using a trimming process, thereby laterally enlarging the first spaces 108. As a result of the trimming process, each of the first spaces 108 may have a second width W2 which is greater than the first width W1. While the trimming process is performed, an etching gas may be supplied into the first and second spaces 108 and 109, thereby laterally etching the exposed vertical channel regions 140. Thus, the vertical channel regions 140 may be formed such that some portions of the vertical channel regions 140 surrounded by the insulation layers 110 have a width which is greater than that of some portions of the vertical channel regions 140 exposed by the first spaces 108 and the recessed regions 109a. That is, each of the vertical channel regions 140 may be formed to include an uneven sidewall. Subsequently, portions of spacers 115 on sidewalls of the SSL cut 111 and the remained sacrificial layers 120a may be removed using a second pull-back process. Second spaces 109 may be formed by removing the remained sacrificial layers 120a. Thus, the second spaces 109 may be formed to have the first height H1. According to the present exemplary embodiment, a pre-cleaning process for isotropically etching the insulation layers 110 may be omitted.

Referring to FIG. 5C, a data storage layer 150 may be conformally formed to cover inner surfaces of the first and second spaces 108 and 109. Gate electrodes 160 may be then formed to fill the first and second spaces 108 and 109. The gate electrodes 160 may constitute a gate stack 20. The gate stack 20 may include an uppermost gate electrode (e.g., a sixth gate electrode 166) among the gate electrodes 160, and the SSL cut 111 may divide the sixth gate electrode 166 into two separate portions. According to the present exemplary embodiment, the vertical channel regions 140 may be partially shrunk to increase the width of the first spaces 108. With reference to FIG. 5E, this may be understood to mean that distances P1 and P2 between the vertical channel regions 140 are increased to allow a deposition process gas for forming the gate electrodes 160 to harmoniously and/or smoothly flow into the first spaces 108 and the second spaces 109. Thus, formation of voids in the gate electrodes 160 may be prevented or suppressed.

Referring to FIG. 5D, common sources 102, isolation layers 175, plugs 182 and bit lines 180 may be formed to complete a semiconductor memory device 4.

Fifth Embodiments

FIGS. 6A to 6E are cross sectional views illustrating a method of fabricating a semiconductor memory device according to some exemplary embodiments.

Figure 6A:
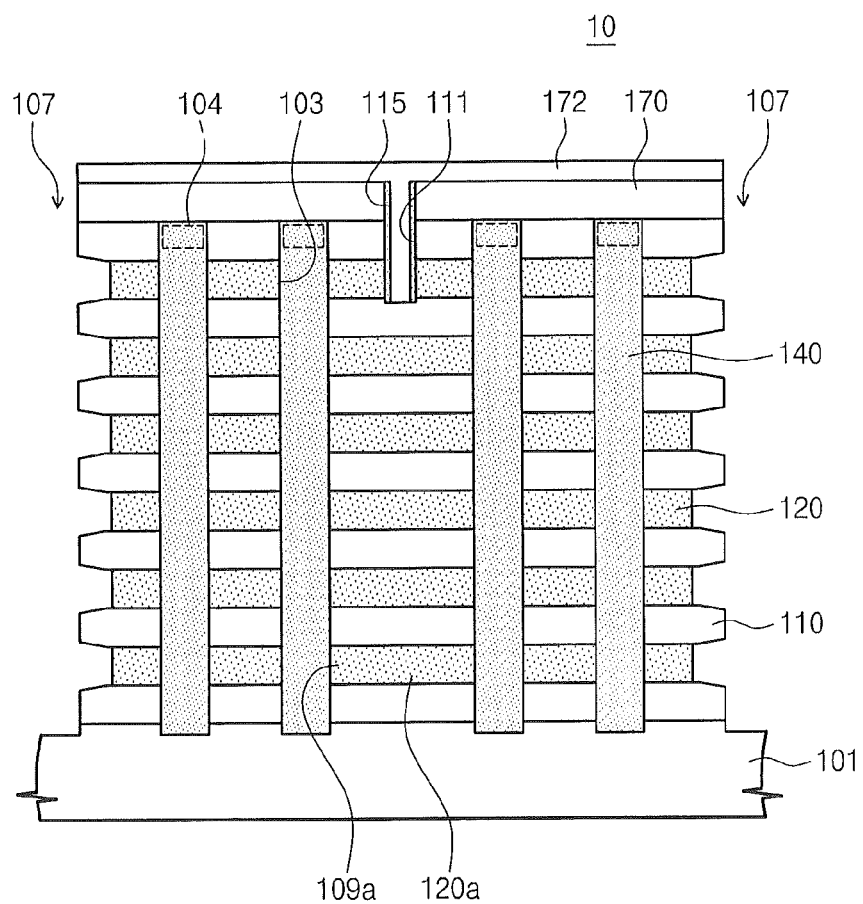
FIGS. 6A to 6E are cross sectional views illustrating a method of fabricating a semiconductor memory device according to some exemplary embodiments.

Referring to FIG. 6A, insulation layers 110 and sacrificial layers 120 may be alternately and repeatedly stacked on a substrate 101 to form a mold stack 10. Vertical channel region holes 103 penetrating the mold stack 10 may be formed to expose the substrate 101, and vertical channel regions 140 may be formed to fill respective ones of the vertical channel region holes 103. Each of the vertical channel regions 140 may include a drain 104 formed in an upper portion thereof. A capping insulation layer 170 may be formed on the uppermost insulation layer 110 and on the vertical channel regions 140, and the capping insulation layer 170 and the mold stack 10 may be patterned to form an SSL cut 111. Spacers 115 may be formed on sidewalls of the SSL cut 111. A non-sacrificial layer 172 may be formed to fill the SSL cut 111 and to cover the capping insulation layer 170. Word line (WL) cuts 107 may be formed using the same or similar manners as described in the first embodiment, and the sacrificial layers 120 may be partially etched using a first pull-back process. The first pull-back process may be performed with an etch recipe that exhibits a low etch selectivity with respect to the insulation layers 110. For example, the first pull-back process may be performed using a phosphoric acid solution including a hydrofluoric solution as an etchant, and the etch selectivity with respect to the insulation layers 110 may be controlled by varying a concentration of the hydrofluoric solution in the etchant. According to the present embodiment, the corners of the insulation layers 110 adjacent to the WL cuts 107 may be etched to have a rounded shape during the first pull-back process.

Figure 6B:
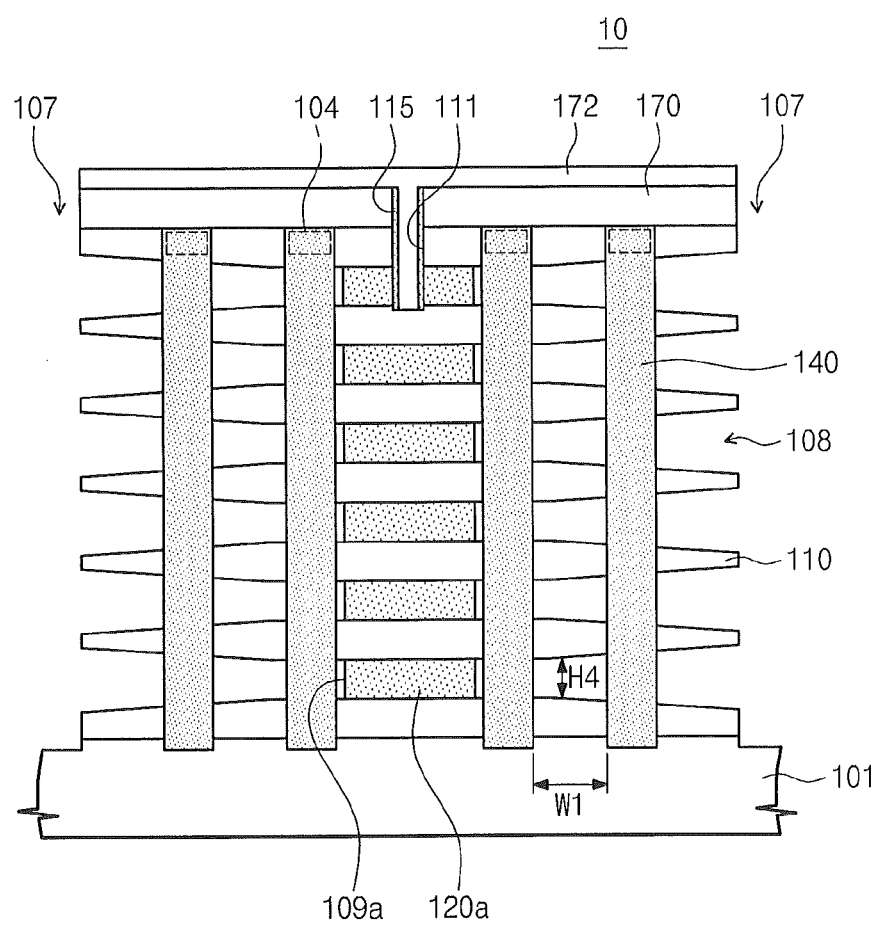

Referring to FIG. 6B, the first pull-back process may be additionally performed with the etchant having a low etch selectivity, thereby partially removing the sacrificial layers 120. As a result of the first pull-back process, edge portions of the sacrificial layers 120 may be removed to form first spaces 108 between the vertically stacked insulation layers 110, and central portions 120a of the sacrificial layers 120 may remain. During the first pull-back process, the sacrificial layers 120 may be more etched to form recessed regions 109a. According to the present embodiment, the first spaces 108 may be formed to have a first width W1 and a variable height H4. The variable height H4 may gradually increase from a central portion of the mold stack 10 toward edges of the mold stack 10. That is, a thickness of each of the insulation layers 110 may be gradually reduced toward edges of the mold stack 10, as illustrated in FIG. 6B.

Figure 6C:
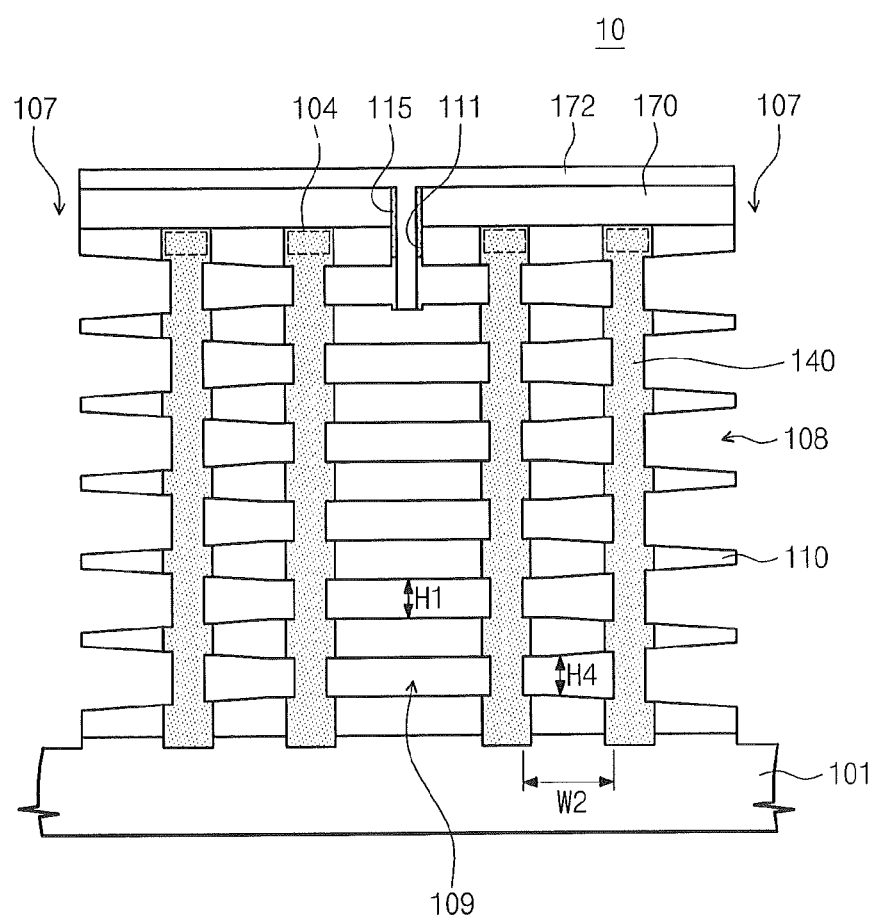

Referring to FIG. 6C, the vertical channel regions 140 exposed by the first spaces 108 and the recessed regions 109a may be etched using a trimming process. Consequently, the first spaces 108 may be laterally enlarged to have a second width W2 which is greater than the first width W1. Entire portions of the remained sacrificial layers 120a may be removed to form second spaces 109 having the first height H1. While the second spaces 109 are formed, at least some portions of the spacers 115 may be etched. According to the present exemplary embodiment, the inclined top and bottom surfaces of the first spaces 108 may be formed by the first pull-back process, and the width of the first spaces 108 may be increased by the trimming process.

Figure 6D:
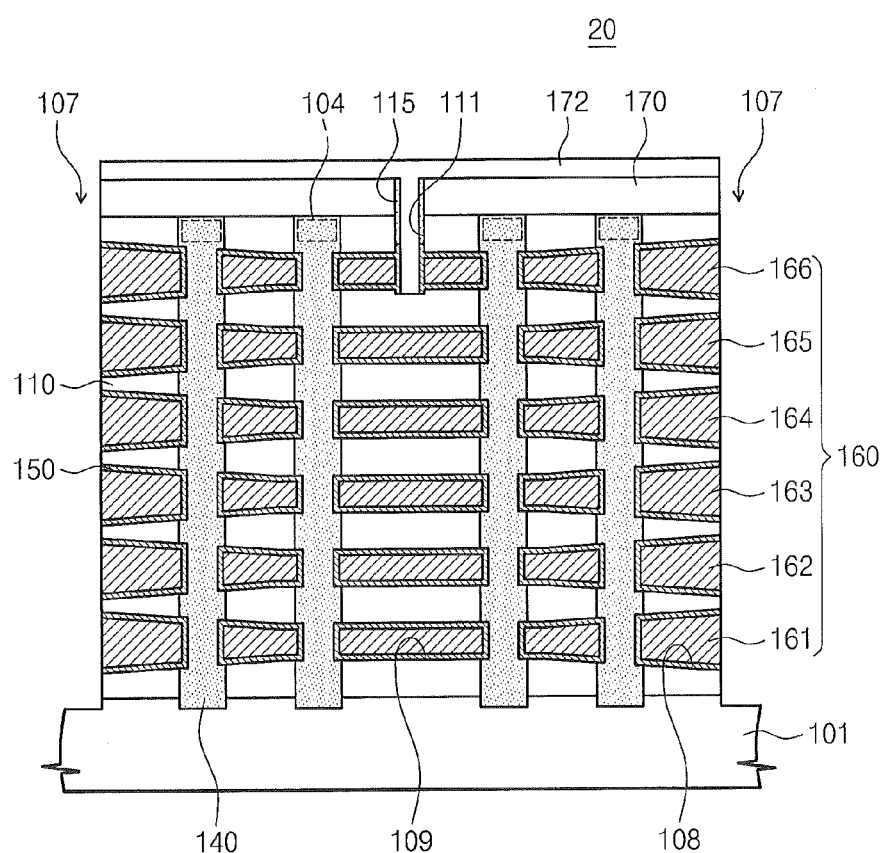

Referring to FIG. 6D, a data storage layer 150 may be conformally formed to cover inner surfaces of the first and second spaces 108 and 109. Gate electrodes 160 may be then formed to fill the first and second spaces 108 and 109. The gate electrodes 160 may constitute a gate stack 20. As described above, the first spaces 108 may be formed to have the variable height 114 and the second width W2. In particular, the variable height H4 may gradually increase toward the WL cuts 107. Accordingly, a deposition process gas, for example, a tungsten hexafluoride ($WF_6$) gas for forming the gate electrodes 160 may be harmoniously and/or smoothly flowed into the first spaces 108 and the second spaces 109. Consequently, the configuration of the first and second spaces 108 and 109 may prevent or suppress formation of voids in the gate electrodes 160. The gate electrodes 160 filling the second spaces 109 may be thinner than the gate electrodes 160 filling the first spaces 108. The sixth gate electrode 166 (an uppermost gate electrode among the gate electrodes 160) may be divided into two separate portions by the SSL cut 111.

Figure 6E:
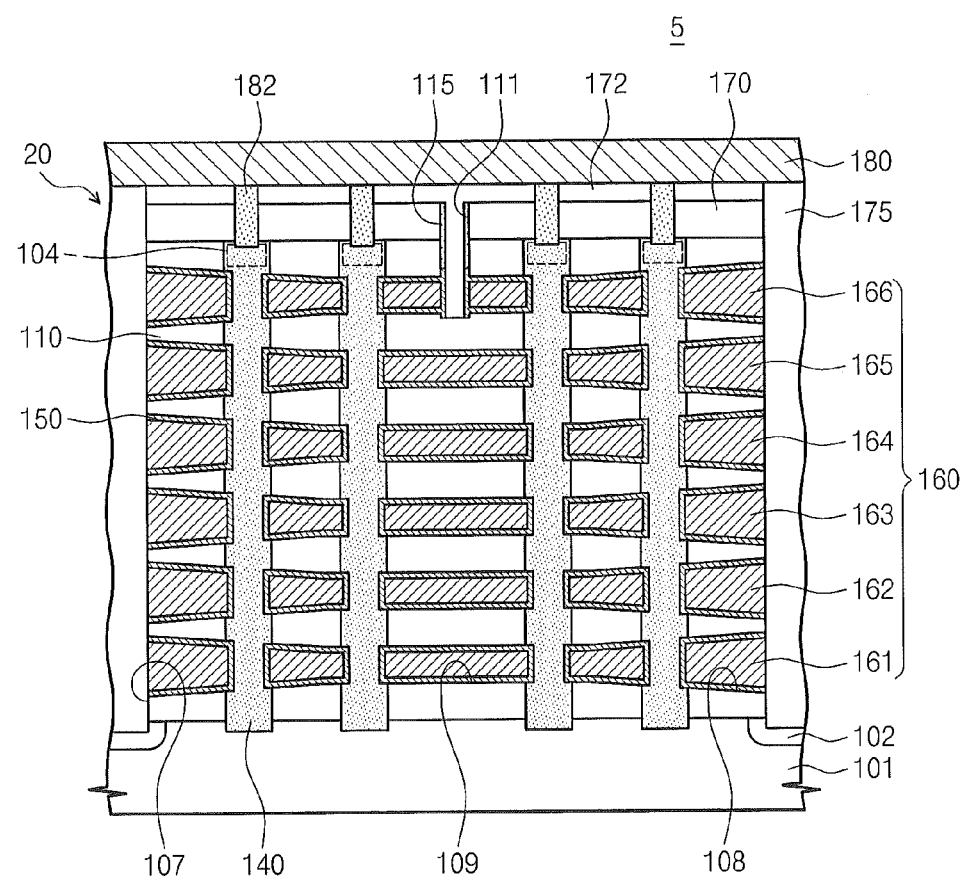

Referring to FIG. 6E, common sources 102, isolation layers 175, plugs 182 and bit lines 180 may be formed to complete a semiconductor memory device 5.

Sixth Embodiments

FIGS. 7A to 7E are cross sectional views illustrating a method of fabricating a semiconductor memory device according to some exemplary embodiments.

Figure 7A:
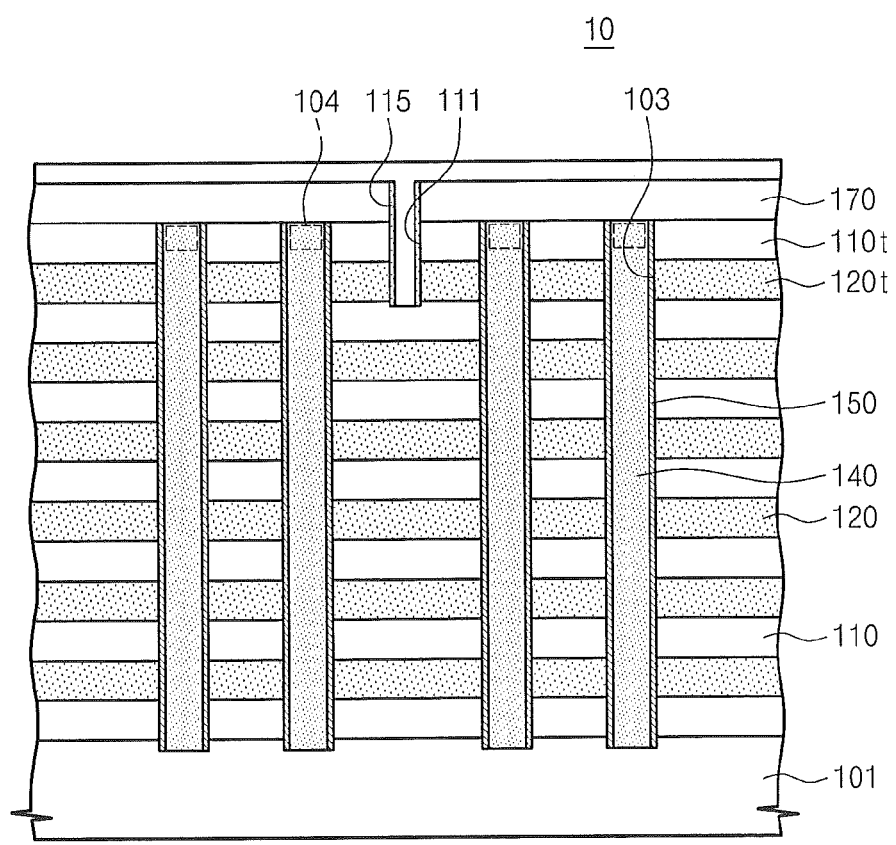
FIGS. 7A to 7E are cross sectional views illustrating a method of fabricating a semiconductor memory device according to some exemplary embodiments.

Referring to FIG. 7A, insulation layers 110 and sacrificial layers 120 may be alternately and repeatedly stacked on a substrate 101 to form a mold stack 10. Vertical channel region holes 103 penetrating the mold stack 10 may be formed to expose the substrate 101, and vertical channel regions 140 may be formed to fill respective ones of the vertical channel region holes 103. Impurities may be injected into upper portion of the vertical channel regions 140 to form drains 104. Before the vertical channel regions 140 are formed, a data storage layer 150 may be conformally formed on sidewalls of vertical channel region holes 103. That is, vertical channel region holes 103 may be surrounded by the data storage layer 150. A capping insulation layer 170 may be formed on the uppermost insulation layer 110t and on the vertical channel regions 140. The capping insulation layer 170, the uppermost insulation layer 110t and the uppermost sacrificial layer 120t may be patterned to form an SSL cut 111. Spacers 115 may be formed on sidewalls of the SSL cut 111. A non-sacrificial layer 172 may be formed to fill the SSL cut 111 and to cover the capping insulation layer 170.

Figure 7B:
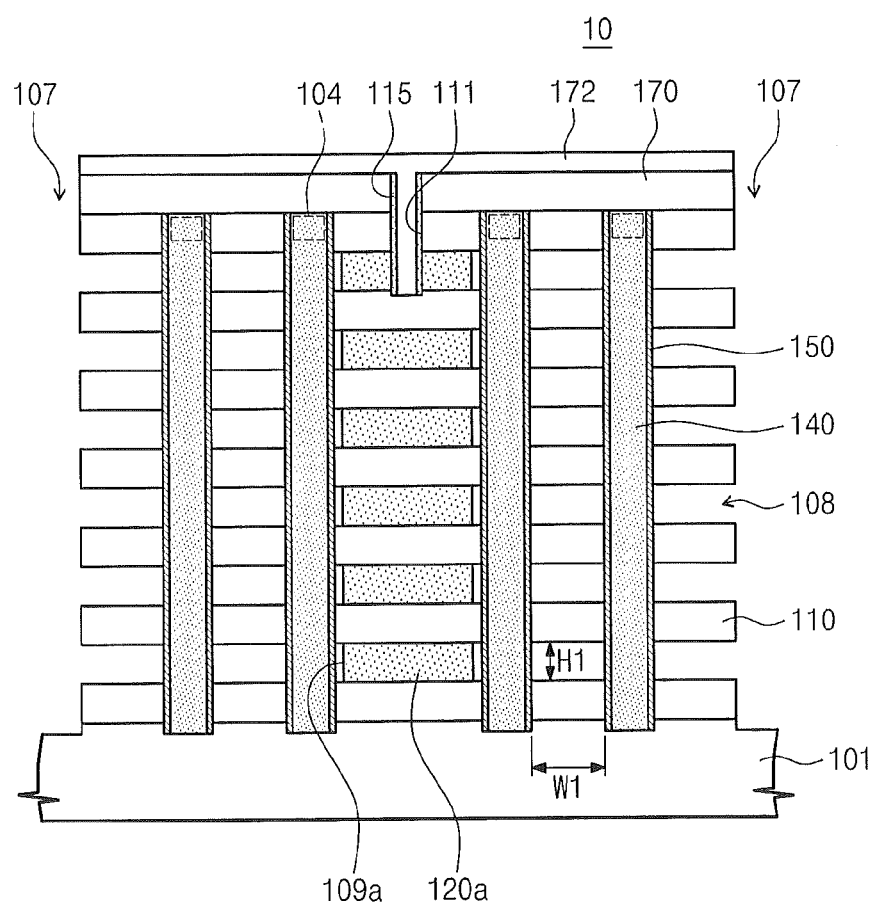

Referring to FIG. 7B, word line (WL) cuts 107 may be formed using the same or similar manners as described in the first embodiment. The sacrificial layers 120 may be partially etched using a first pull-back process, thereby forming first spaces 108. Central portions 120a of the sacrificial layers 120 may remain after formation of the first spaces 108. Each of the first spaces 108 may be formed to have a first width W1 and a first height H1. While the first pull-back process is performed, the remained sacrificial layers 120a may be further etched to form recessed regions 109a that expose the data storage layer 150.

Figure 7C:
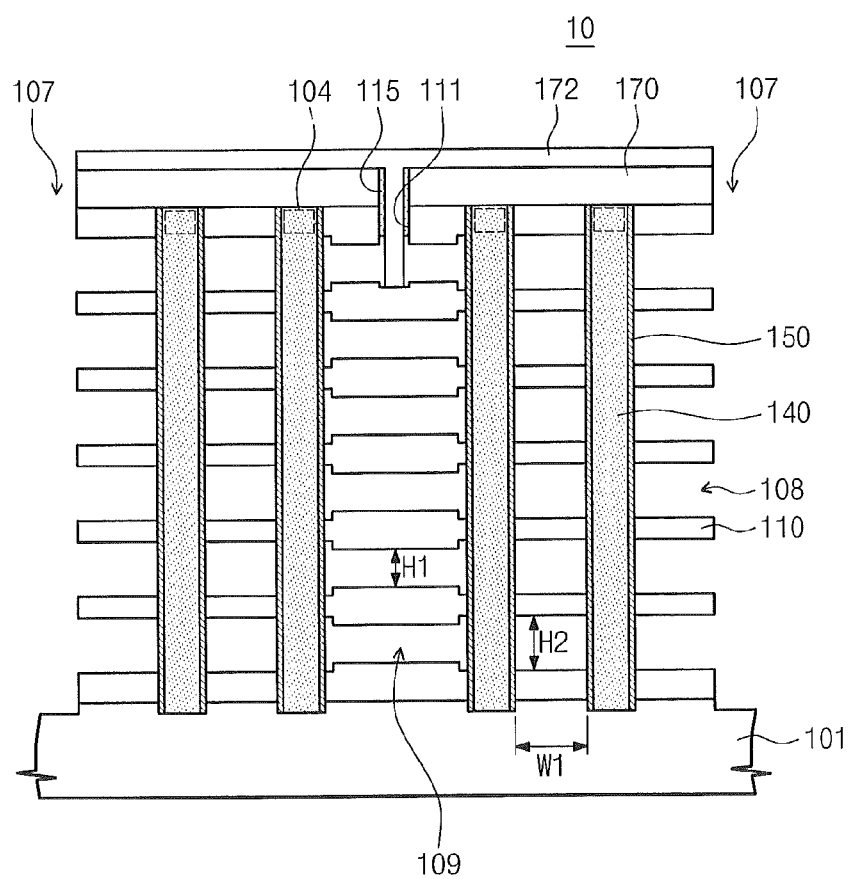

Referring to FIG. 7C, the insulation layers 110 may be isotropically etched using a pre-cleaning process, thereby increasing the first height H1 of the first spaces 108. That is, the first spaces 108 may be vertically enlarged by the pre-cleaning process, thereby having a second height H2 which is greater than the first height H1. The remained sacrificial layers 120a may be removed using a second pull-back process, thereby forming second spaces 109 having the first height H1. While the second spaces 109 are formed, at least some portions of the spacers 115 may be etched. Both edges of each of the second spaces 109 may be formed to have a height which is greater than the first height H1. This may be due to the presence of the recessed regions 109a.

Figure 7D:
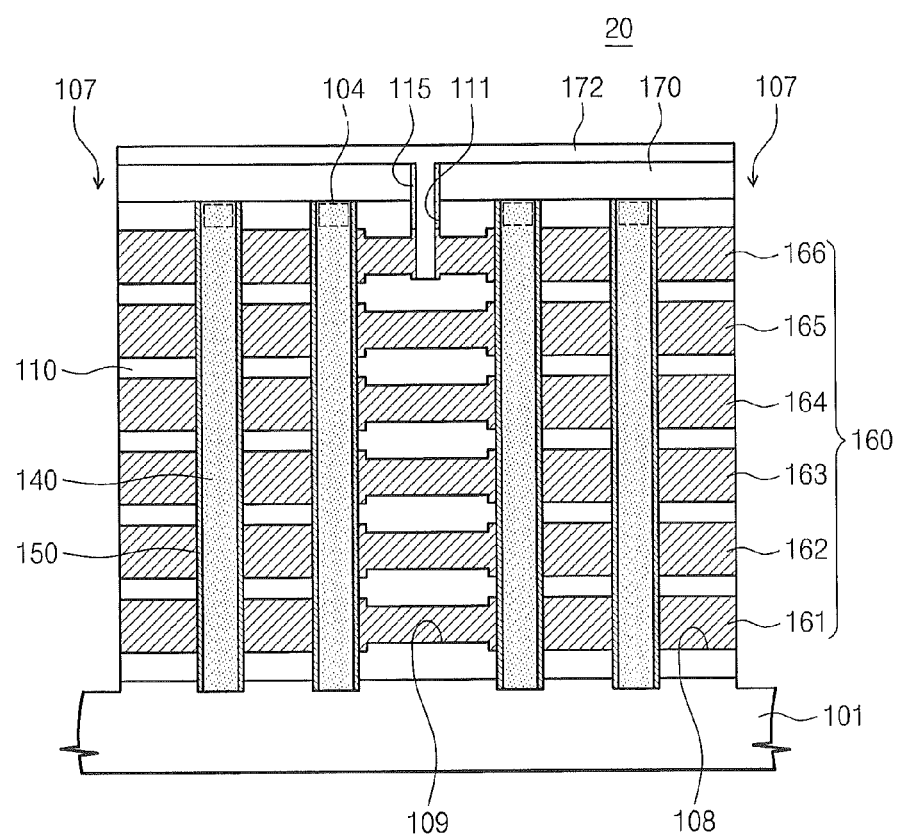

Referring to FIG. 7D, gate electrodes 160 may be then formed to fill the first and second spaces 108 and 109. The gate electrodes 160 may constitute a gate stack 20. According to the present exemplary embodiment, the height of the first spaces 108 may be greater than the height of the second spaces 109. Thus, a deposition process gas, for example, a tungsten hexafluoride ($WF_6$) gas for forming the gate electrodes 160 may be harmoniously and/or smoothly flowed into the first spaces 108 and the second spaces 109. Consequently, the configuration of the first and second spaces 108 and 109 may prevent or suppress formation of voids in the gate electrodes 160. The gate electrodes 160 filling the second spaces 109 may be thinner than the gate electrodes 160 filling the first spaces 108. The sixth gate electrode 166 (an uppermost gate electrode among the gate electrodes 160) may be divided into two separate portions by the SSL cut 111.

Figure 7E:
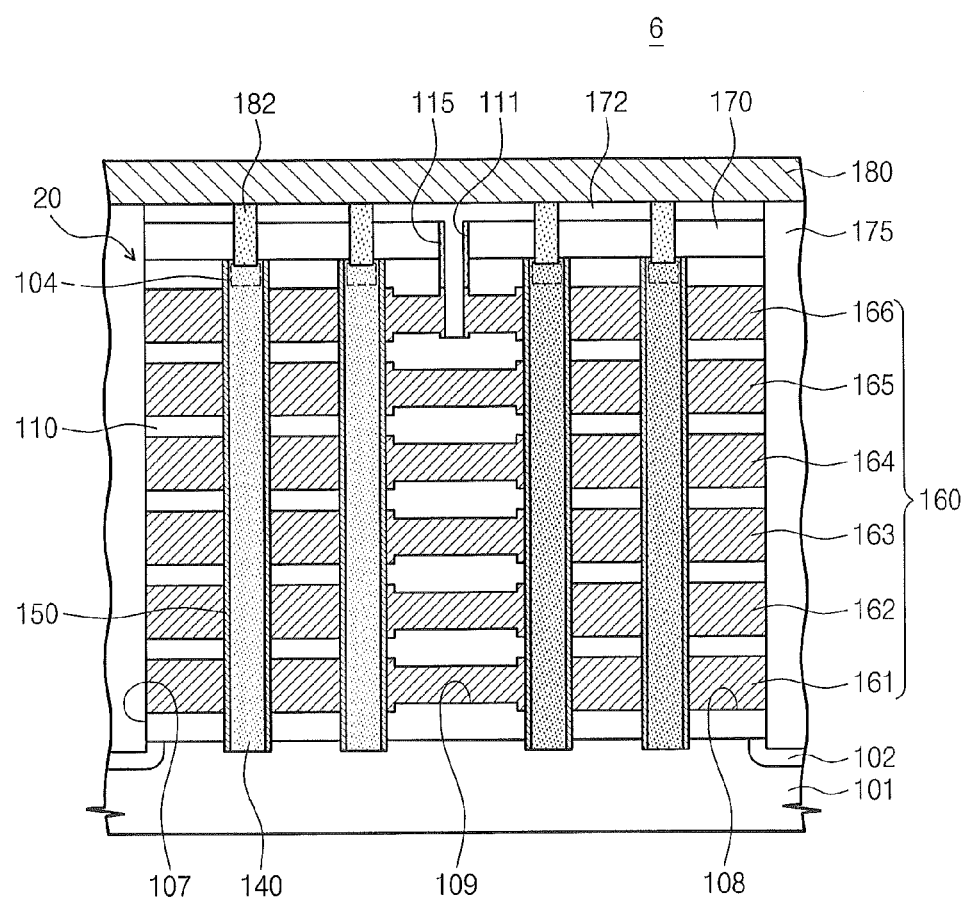

Referring to FIG. 7E, common sources 102, isolation layers 175, plugs 182 and bit lines 180 may be formed to complete a semiconductor memory device 6.

Seventh Embodiments

Figure 8A:
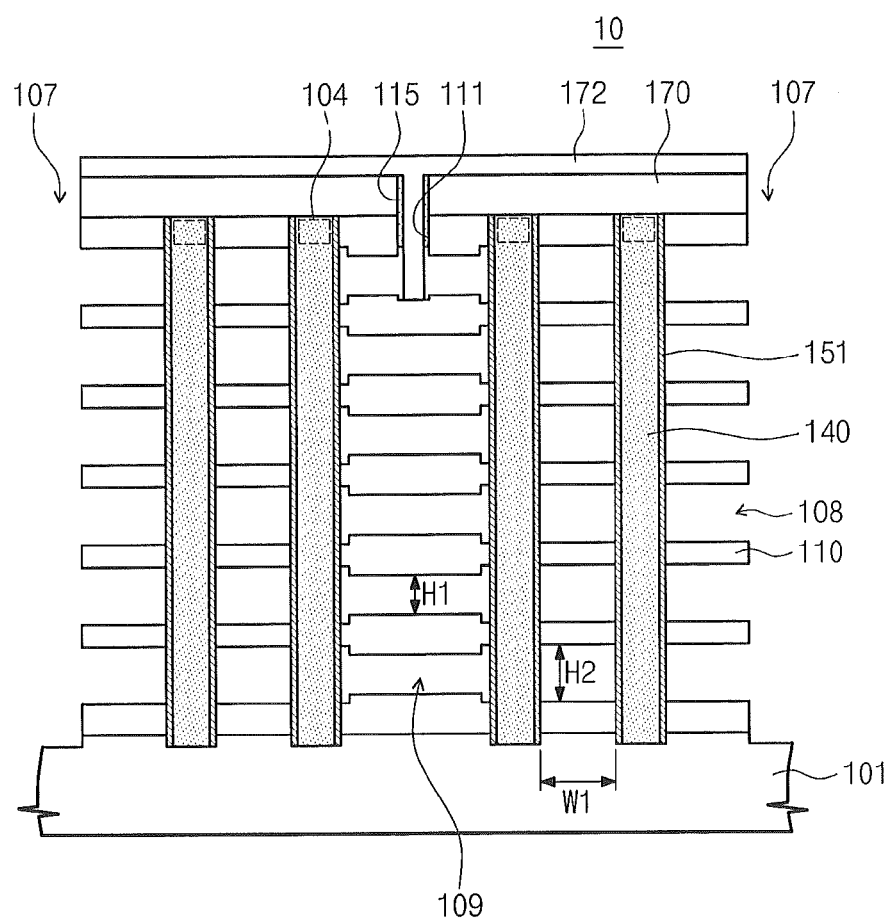
FIGS. 8A to 8C are cross sectional views illustrating a method of fabricating a semiconductor memory device according to some exemplary embodiments.
Figure 8B:
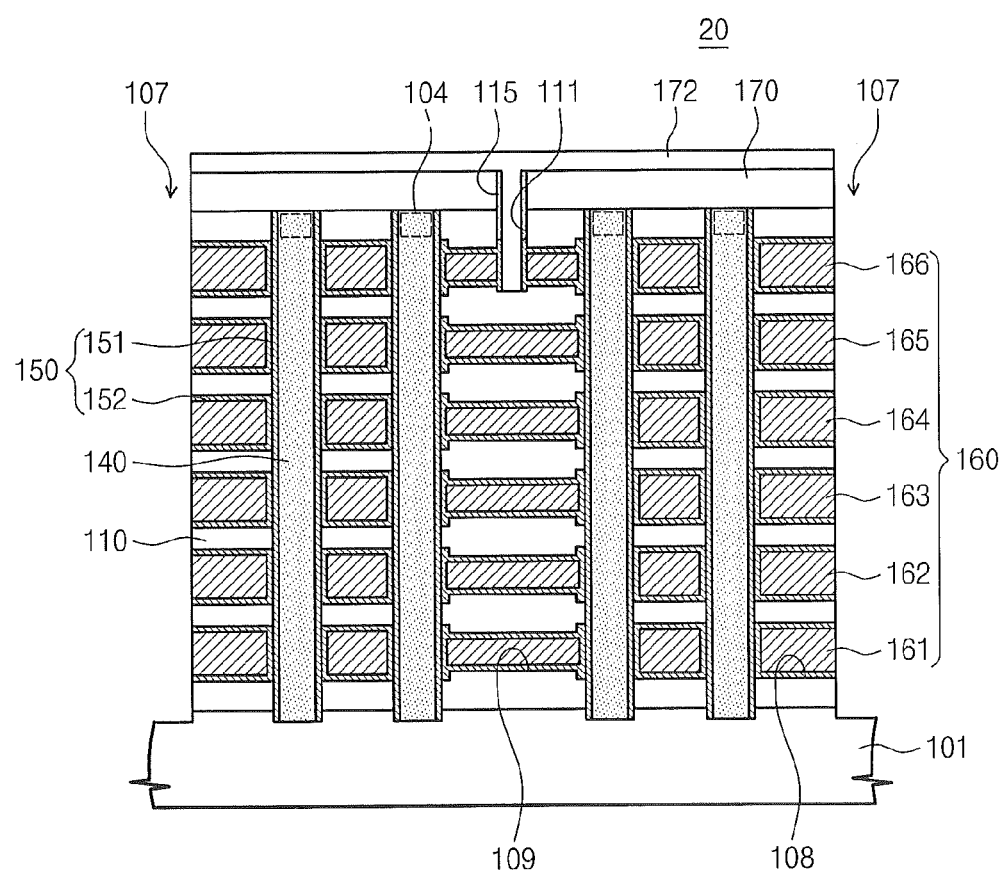
Figure 8C:
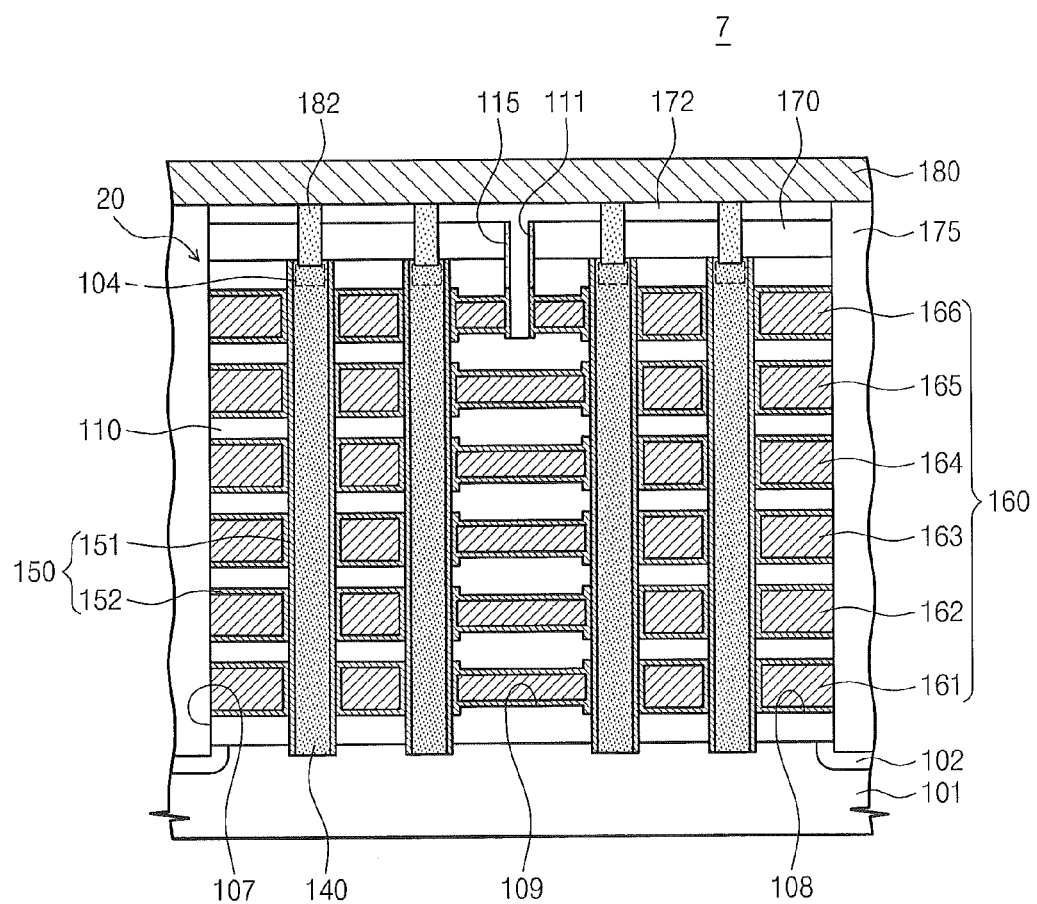

FIGS. 8A to 8C are cross sectional views illustrating a method of fabricating a semiconductor memory device according to some exemplary embodiments.

Referring to FIG. 8A, a mold stack 10 including first spaces 108 and second spaces 109 may be formed on a substrate 101. The mold stack 10 may be formed using the same or similar manners as described with reference to FIGS. 7A, 7B and 7C. Accordingly, each of the first spaces 108 may have a first width W1 and a second height H2, and each of the second spaces 109 may have a first height H1 less than the second height H2. Vertical channel regions 140 may be formed to penetrate the mold stack 10. A first data storage layer 151 may be formed to surround sidewalls of the vertical channel regions 140.

Referring to FIG. 8B, a second data storage layer 152 may be conformally formed on inner surfaces of the first and second spaces 108 and 109. Gate electrodes 160 including an uppermost gate electrode 166 may be then formed to fill the first and second spaces 108 and 109. The uppermost gate electrode 166, for example, a sixth gate electrode may divide into two separate portions by the SSL cut 111. The gate electrodes 160 may constitute a gate stack 20. According to the present exemplary embodiment, the height of the first spaces 108 may be greater than the height of the second spaces 109. Thus, a deposition process gas, for example, a tungsten hexafluoride ($WF_6$) gas for forming the gate electrodes 160 may be harmoniously and/or smoothly flowed into the first spaces 108 and the second spaces 109. Consequently, the configuration of the first and second spaces 108 and 109 may prevent or suppress formation of voids in the gate electrodes 160. The first data storage layer 151 and the second data storage layer 152 may constitute a data storage layer 150. The first data storage layer 151 may include a tunnel insulation layer, and the second data storage layer 152 may include a blocking insulation layer. Either the first data storage layer 151 or the second data storage layer 152 may include a trap insulation layer.

Referring to FIG. 8C, common sources 102, isolation layers 175, plugs 182 and bit lines 180 may be formed to complete a semiconductor memory device 7.

Eighth Embodiments

FIGS. 9A to 9E are cross sectional views illustrating a method of fabricating a semiconductor memory device according to some exemplary embodiments.

Figure 9A:
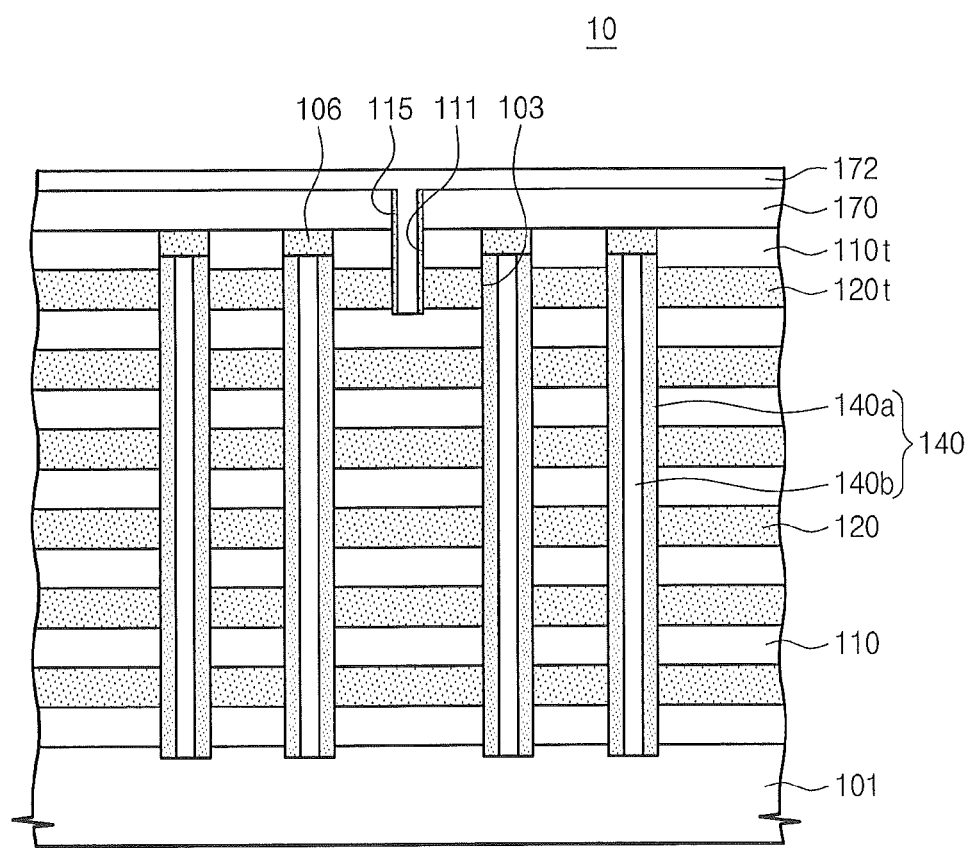
FIGS. 9A to 9E are cross sectional views illustrating a method of fabricating a semiconductor memory device according to some exemplary embodiments.

Referring to FIG. 9A, insulation layers 110 and sacrificial layers 120 may be alternately and repeatedly stacked on a substrate 101 to form a mold stack 10. Vertical channel region holes 103 penetrating the mold stack 10 may be formed to expose the substrate 101, and vertical channel regions 140 may be formed to fill respective ones of the vertical channel region holes 103. The vertical channel regions 140 may be formed by depositing a semiconductor layer 140a on sidewalls of the vertical channel region holes 103 and by filling the vertical channel region holes 103 surrounded by the semiconductor layer 140a with an insulation filling layer 140b. Thus, the semiconductor layer 140a may be formed to have a macaroni shape. The semiconductor layer 140a may be formed by depositing a polycrystalline silicon material or a single crystalline silicon material using a chemical vapor deposition (CVD) technique or an atomic layer deposition (ALD) technique. The filling layer 140b may be formed of a silicon oxide layer or a silicon nitride layer. Capping semiconductor patterns 106 may be additionally formed on respective ones of the vertical channel regions 140. The capping semiconductor patterns 106 may be doped with impurities to act as drains.

A capping insulation layer 170 may be formed on the uppermost insulation layer 110t and the capping semiconductor patterns 106. The capping insulation layer 170, the uppermost insulation layer 110t and the uppermost sacrificial layer 120t may be patterned to form a string selection line (SSL) cut 111. Spacers 115 may be formed on sidewalls of the SSL cut 111. A non-sacrificial layer 172 may be formed to fill the SSL cut 111 and to cover the capping insulation layer 170.

Figure 9B:
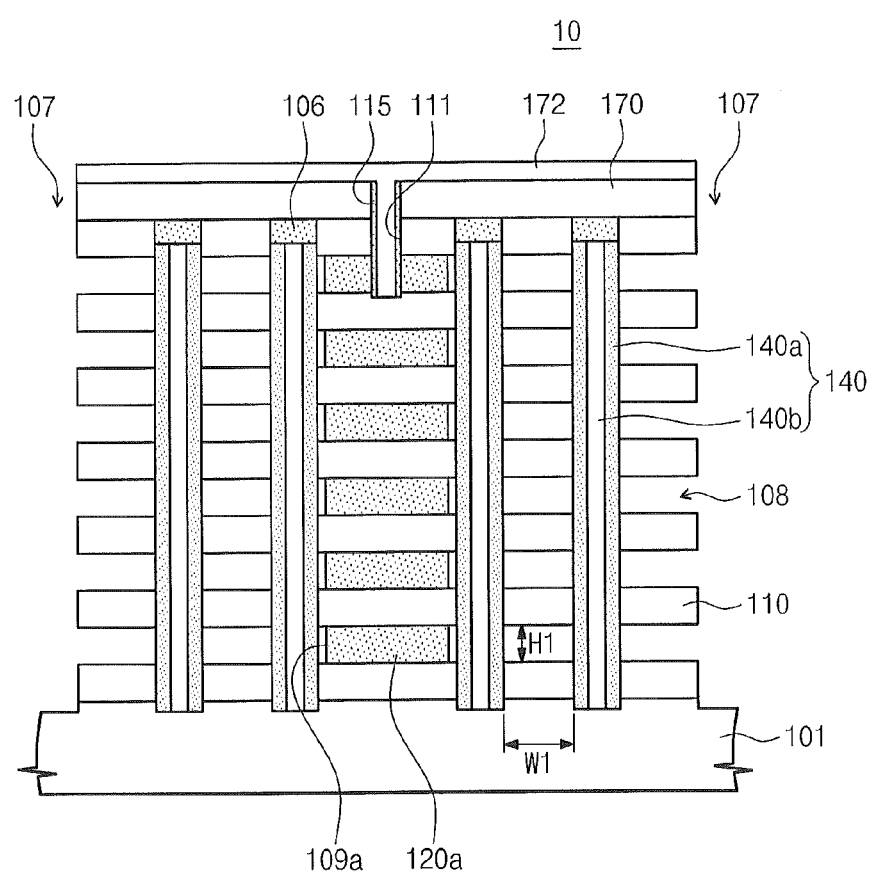

Referring to FIG. 9B, word line (WL) cuts 107 may be formed using the same or similar manners as described in the first embodiment. The sacrificial layers 120 may be partially etched using a first pull-back process, thereby forming first spaces 108. Central portions 120a of the sacrificial layers 120 may remain after formation of the first spaces 108. Each of the first spaces 108 may be formed to have a first width W1 and a first height H1. While the first pull-back process is performed, the remained sacrificial layers 120a may be further etched to form recessed regions 109a that expose the semiconductor layer 140a of the vertical channel regions 140.

Figure 9C:
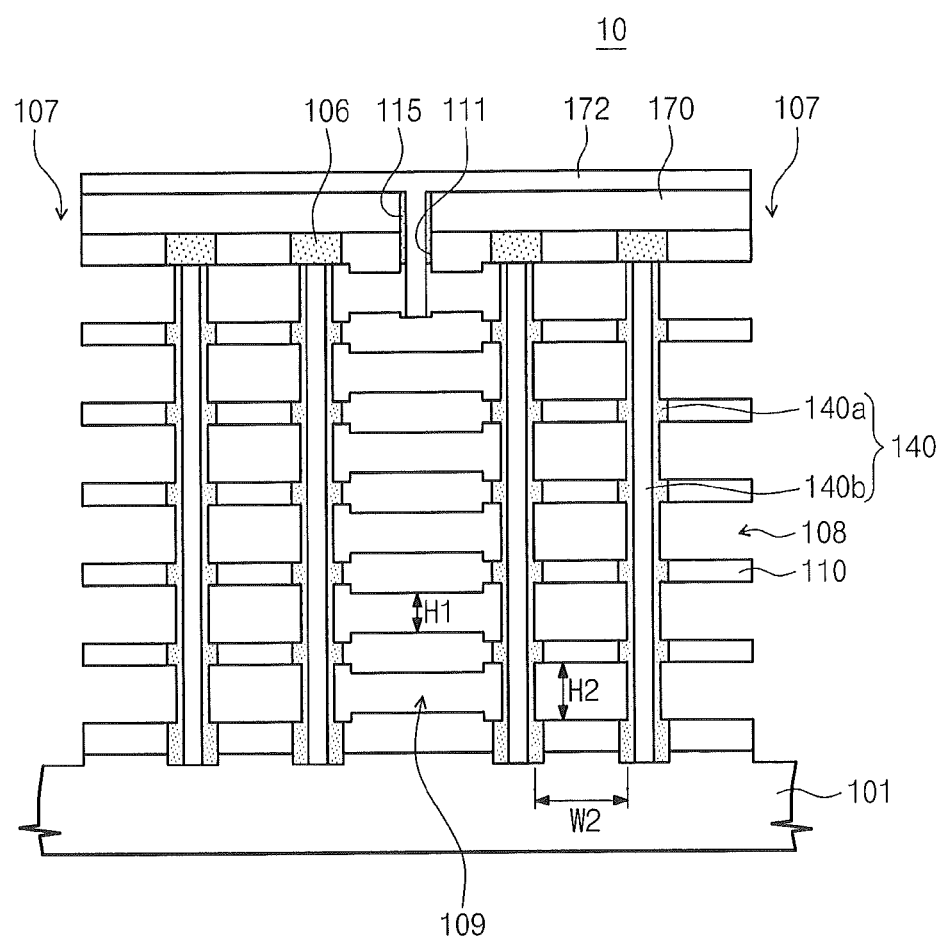

Referring to FIG. 9C, the insulation layers 110 may be isotropically etched using a pre-cleaning process, thereby increasing the first height H1 of the first spaces 108. That is, the first spaces 108 may be vertically enlarged by the pre-cleaning process, thereby having a second height H2 which is greater than the first height H1. The remained sacrificial layers 120a may be removed using a second pull-back process, thereby forming second spaces 109 having the first height H1. While the second spaces 109 are formed, at least some portions of the spacers 115 may be etched. The semiconductor layer 140a of the vertical channel regions 140 may be etched using a trimming process, thereby laterally enlarging the first spaces 108. As a result of the trimming process, each of the first spaces 108 may have a second width W2 which is greater than the first width W1. Further, the vertical channel regions 140 may be formed such that some portions of the semiconductor layer 140a of the vertical channel regions 140 surrounded by the insulation layers 110 have a width which is greater than that of some portions of the vertical channel regions 140 exposed by the first and second spaces 108 and 109.

Figure 9D:
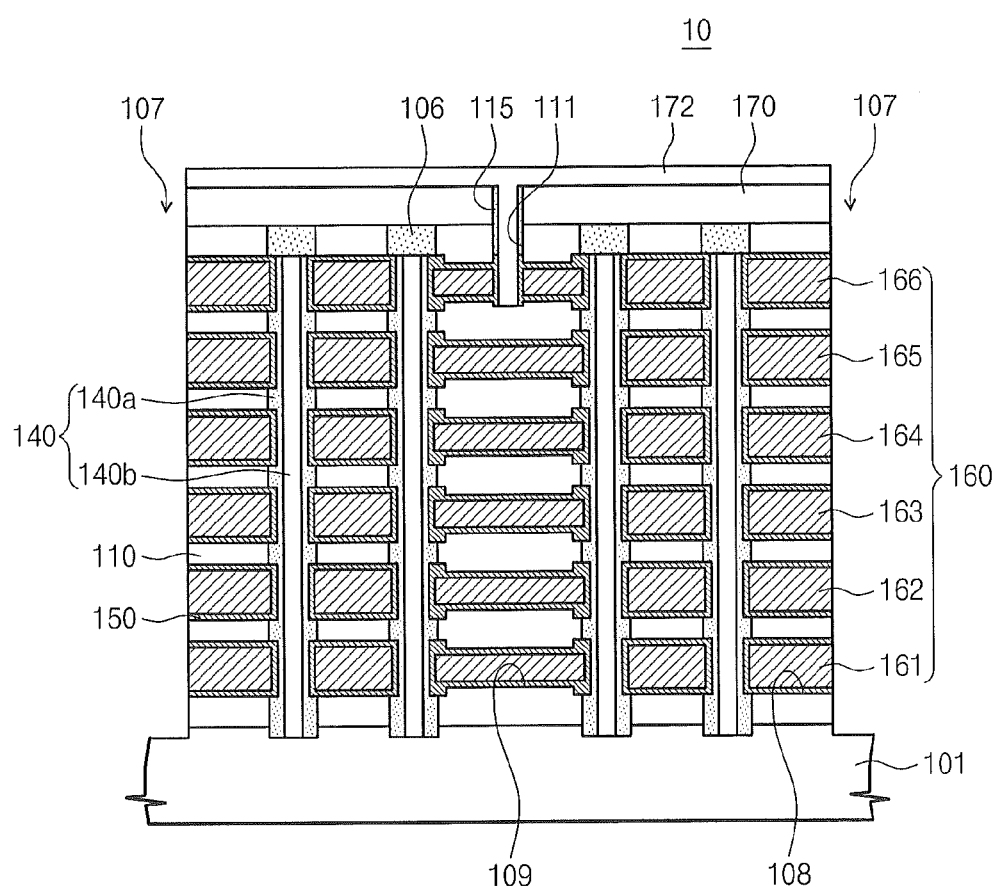

Referring to FIG. 9D, a data storage layer 150 may be conformally formed to cover inner surfaces of the first and second spaces 108 and 109. Gate electrodes 160 may be then formed to fill the first and second spaces 108 and 109. The gate electrodes 160 may constitute a gate stack 20. The gate stack 20 may include an uppermost gate electrode (e.g., a sixth gate electrode 166), and the SSL cut 111 may divide the sixth gate electrode 166 into two separate portions. According to the present exemplary embodiment, the height of the first spaces 108 may be greater than the height of the second spaces 109. Thus, a deposition process gas, for example, a tungsten hexafluoride ($WF_6$) gas for forming the gate electrodes 160 may be harmoniously and/or smoothly flowed into the first spaces 108 and the second spaces 109. Consequently, the configuration of the first and second spaces 108 and 109 may prevent or suppress formation of voids in the gate electrodes 160.

Figure 9E:
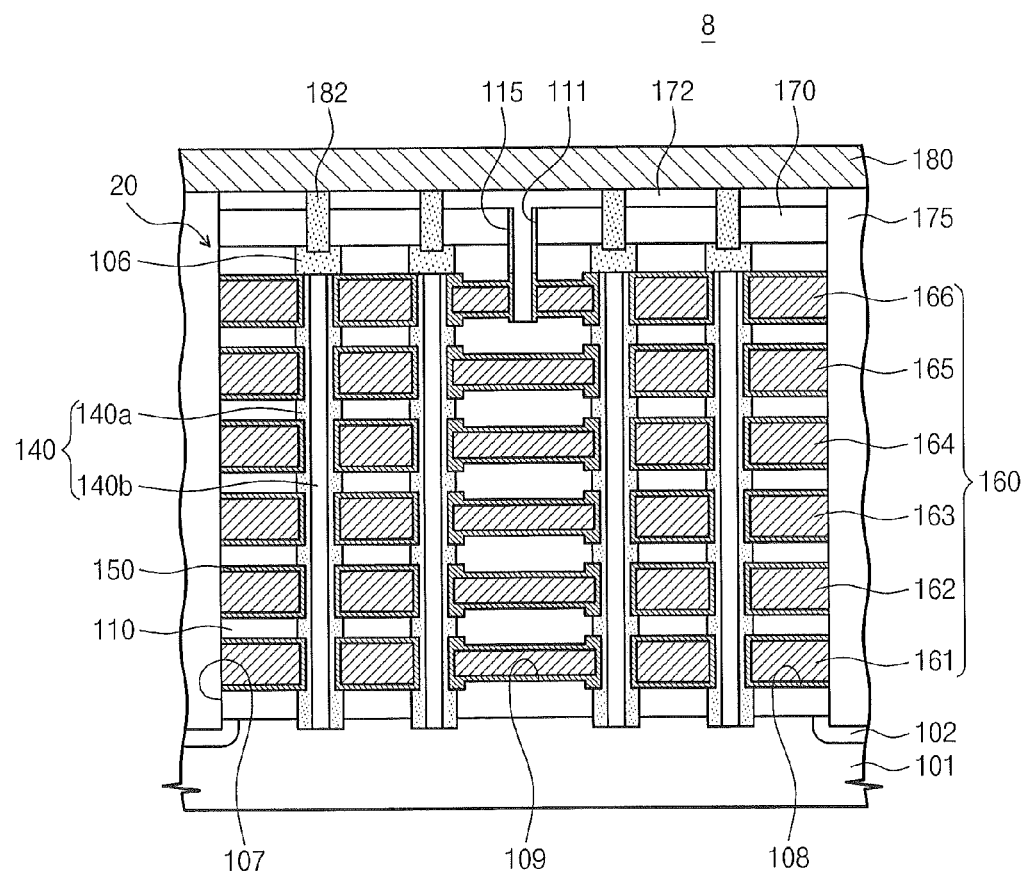

Referring to FIG. 9E, common sources 102, isolation layers 175 and plugs 182 may be formed. Subsequently, bit lines 180 may be formed on the non-sacrificial layer 172. The bit lines 180 may be electrically connected to the capping semiconductor patterns 106 through the plugs 182. As such, a semiconductor memory device 8 may be realized.

Ninth Embodiments

FIGS. 10A to 10E are cross sectional views illustrating a method of fabricating a semiconductor memory device according to some exemplary embodiments.

Figure 10A:
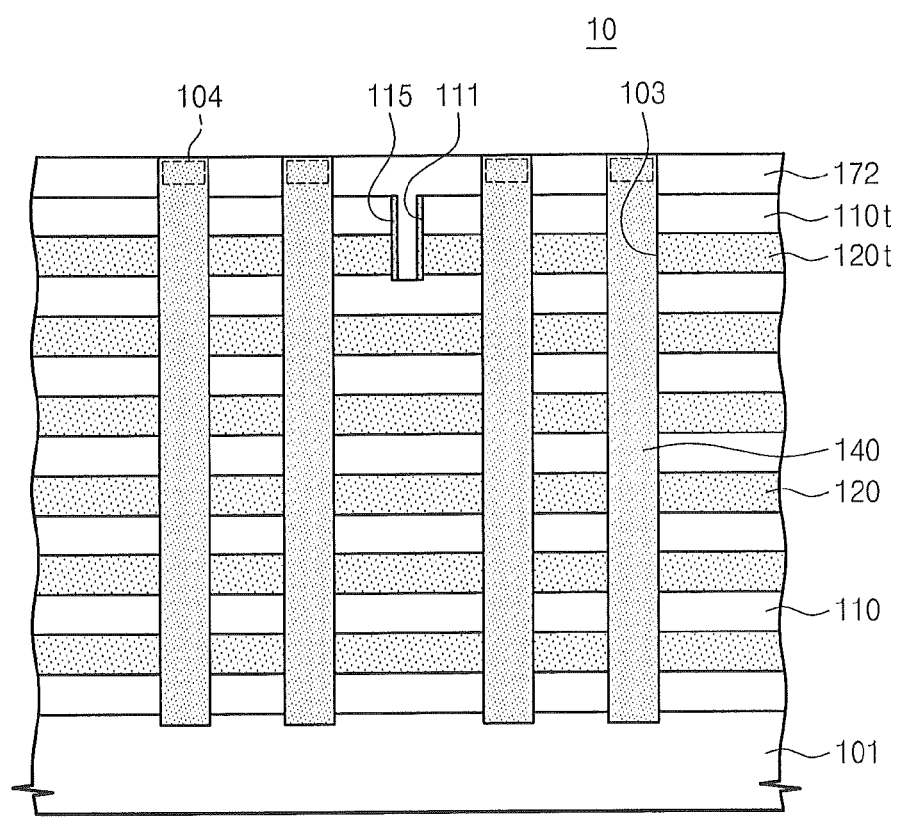
FIGS. 10A to 10E are cross sectional views illustrating a method of fabricating a semiconductor memory device according to some exemplary embodiments.

Referring to FIG. 10A, insulation layers 110 and sacrificial layers 120 may be alternately and repeatedly stacked on a substrate 101 to form a mold stack 10. A portion of the mold stack 10 may be etched to form a string selection line (SSL) cut 111 that penetrates the uppermost insulation layer 110t and the uppermost sacrificial layer 120t. Spacers 115 may be formed on sidewalls of the SSL cut 111. A non-sacrificial layer 172 may be formed to fill the SSL cut 111 and to cover the uppermost insulation layer 110t.

The non-sacrificial layer 172 and mold stack 10 may be patterned to form vertical channel region holes 103 exposing the substrate 101. Vertical channel regions 140 may be formed in respective ones of the vertical channel region holes 103. The vertical channel regions 140 may be formed of a conductive layer. Impurities are injected into the upper portions of the vertical channel regions 140, thereby forming drains 104. In some exemplary embodiments, the vertical channel regions 140 may be formed to have a macaroni shape, as described with reference to FIG. 9A.

Figure 10B:
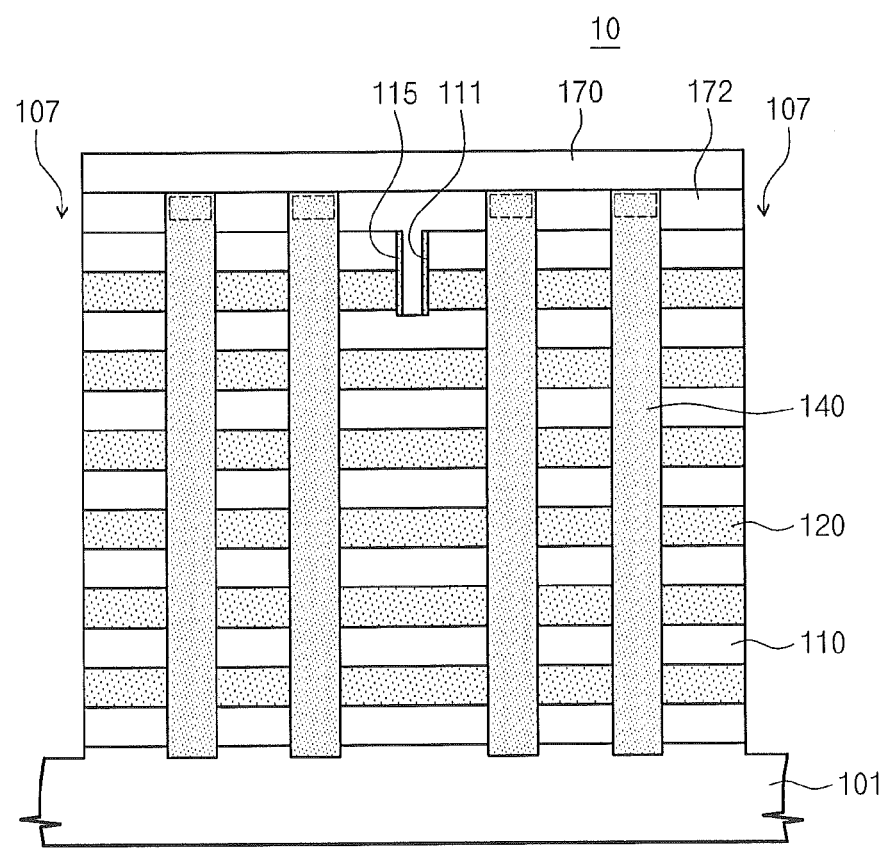

Referring to FIG. 10B, the non-sacrificial layer 172 and mold stack 10 may be patterned to form word line (WL) cuts 107 that expose the substrate 101. Before the WL cuts 107 are formed, a capping insulation layer 170 may be formed on the non-sacrificial layer 172. According to the above descriptions, the vertical channel regions 140 and the capping insulation layer 170 may be formed after the SSL cut 111 and the non-sacrificial layer 172 are formed. Alternatively, after the vertical channel regions 140 are formed, the SSL cut 111, the non-sacrificial layer 172 and the capping insulation layer 170 may be formed. In this case, the vertical channel regions 140 may not be penetrate the non-sacrificial layer 172 but covered with the non-sacrificial layer 172.

Figure 10C:
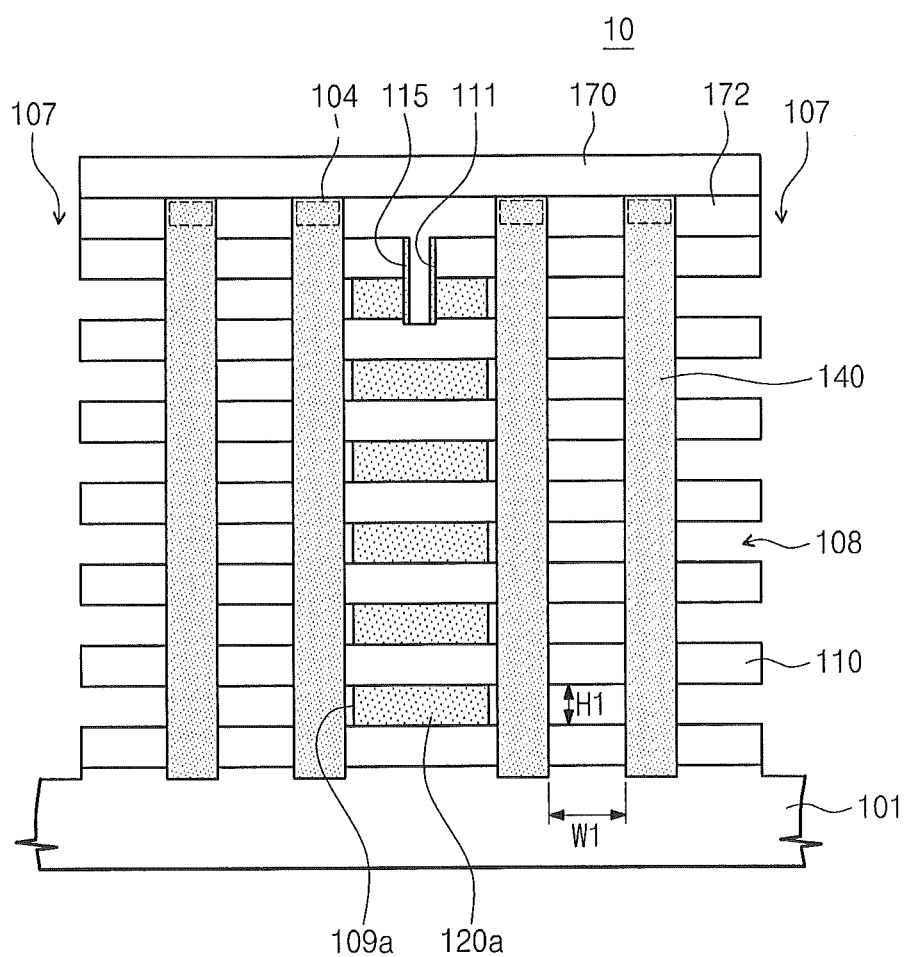

Referring to FIG. 10C, the sacrificial layers 120 may be partially etched using a first pull-back process, thereby forming first spaces 108 having a first width W1 and a first height H1. While the first pull-back process is performed, the sacrificial layers 120 may be further etched to form recessed regions 109a between the vertical channel regions 140 and the remained sacrificial layers 120a. Alternatively, the recessed regions 109a may not be formed, as illustrated in FIG. 3A.

Figure 10D:
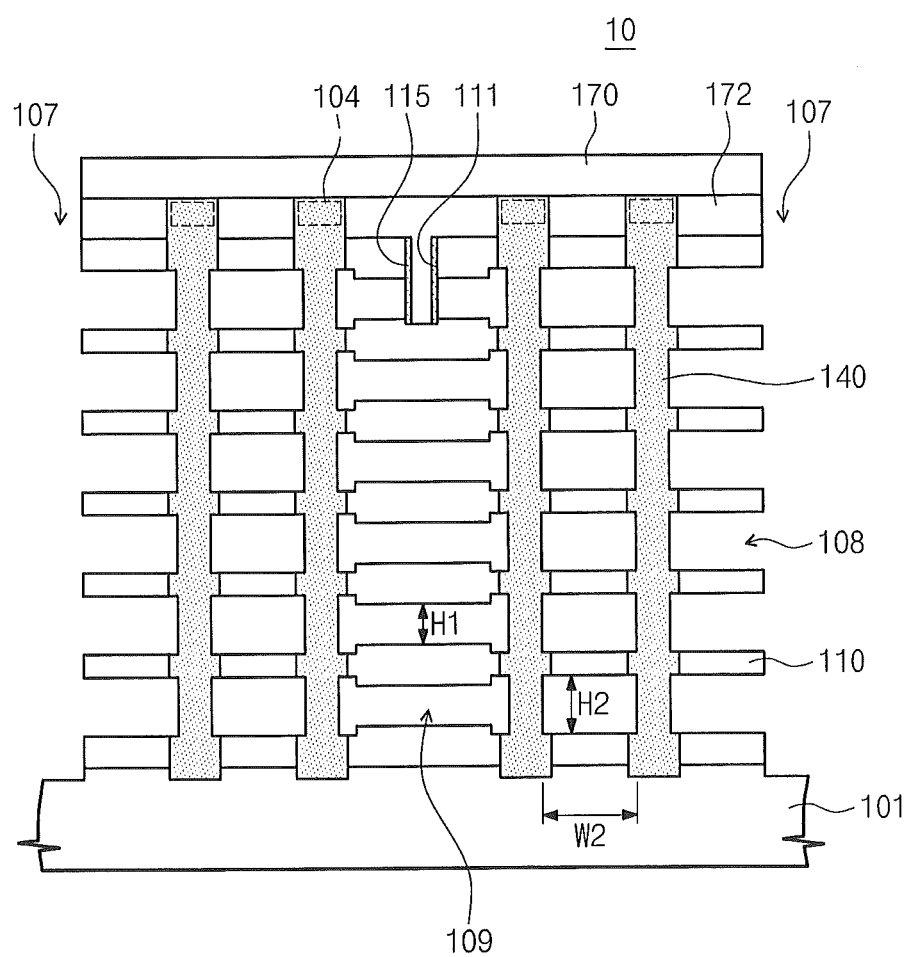

Referring to FIG. 10D, the insulation layers 110 may be isotropically etched using a pre-cleaning process, thereby increasing the height of the first spaces 108. That is, the first spaces 108 may be vertically enlarged to have a second height H2 which is greater than the first height H1. The vertical channel regions 140 may be etched using a trimming process, thereby laterally enlarging the first spaces 108. As a result of the trimming process, each of the first spaces 108 may have a second width W2 which is greater than the first width W1. The remained sacrificial layers 120a may be removed using a second pull-back process, thereby forming second spaces 109 having the first height H1. While the remained sacrificial layers 120a are removed, at least some portions of the spacers 115 may be etched. In some exemplary embodiments, either the trimming process or the pre-cleaning process may be omitted to increase only one of the height and the width of the first spaces 108, as illustrated FIG. 4B or 5B. In some exemplary embodiments, the first spaces 108 may be formed to have the variable height H4 and the second width W2, as illustrated in FIG. 6C.

Figure 10E:
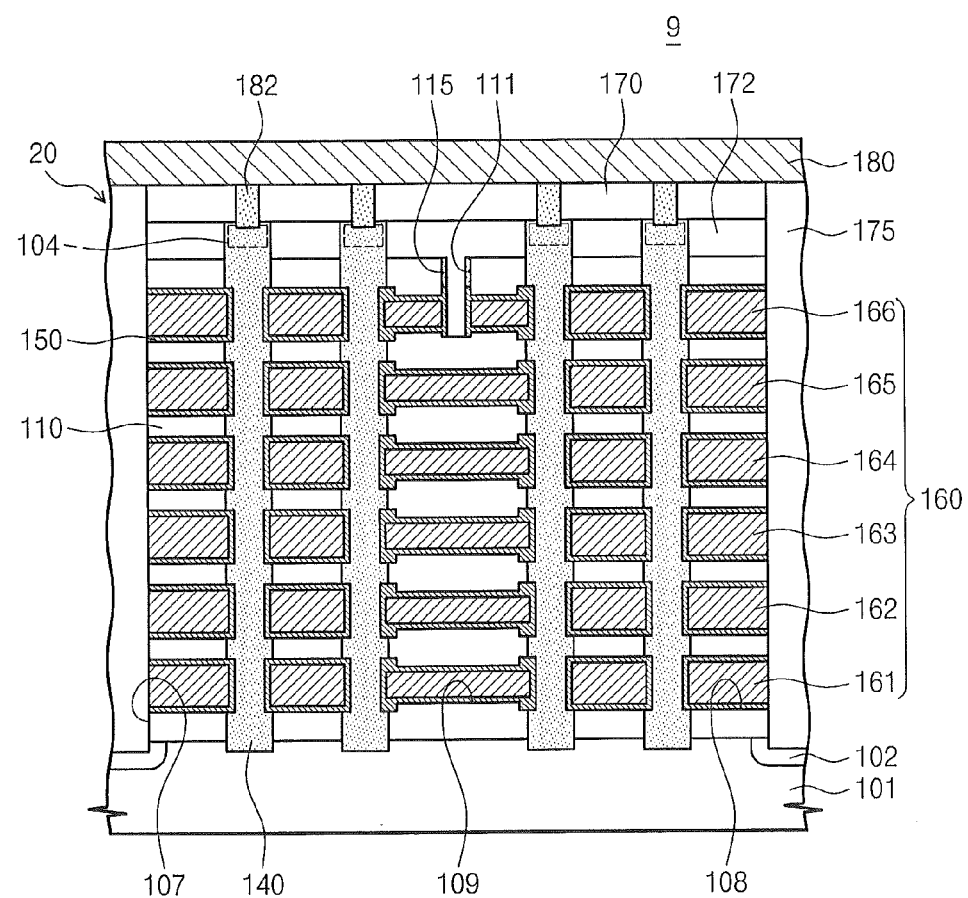

Referring to FIG. 10E, a data storage layer 150 may be conformally formed to cover inner surfaces of the first and second spaces 108 and 109. Gate electrodes 160 may be then formed to fill the first and second spaces 108 and 109. The gate electrodes 160 may constitute a gate stack 20. The gate stack 20 may include an uppermost gate electrode (e.g., a sixth gate electrode 166), and the SSL cut 111 may divide the sixth gate electrode 166 into two separate portions. In some exemplary embodiments, the data storage layer 150 may be formed to surround the entire sidewalls of the vertical channel regions 140, as illustrated in FIG. 7E. In some exemplary embodiments, one portion of the data storage layer 150 may be formed to surround the entire sidewalls of the vertical channel regions 140 and the other portion of the data storage layer 150 may be formed to cover inner surfaces of the first and second spaces 108 and 109. After the data storage layer 150 and the gate electrodes 160 are formed, common sources 102, isolation layers 175, plugs 182 and bit lines 180 may be formed to realize a semiconductor memory device 9.

Tenth Embodiments

FIGS. 11A to 11E are cross sectional views illustrating a method of fabricating a semiconductor memory device according to some exemplary embodiments.

Figure 11A:
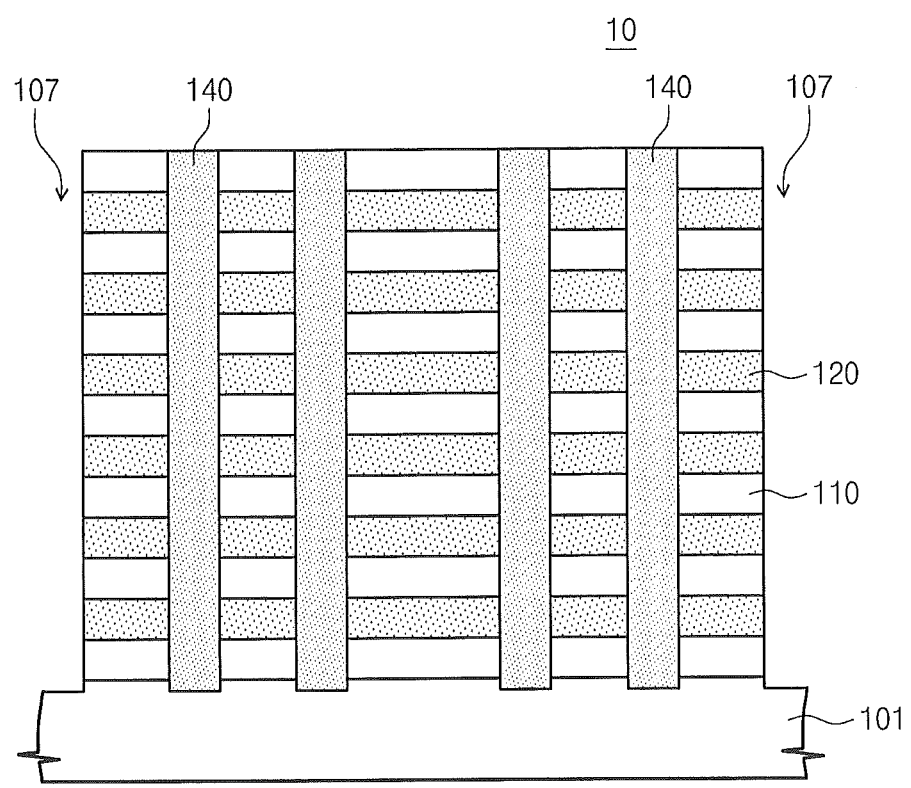
FIGS. 11A to 11E are cross sectional views illustrating a method of fabricating a semiconductor memory device according to some exemplary embodiments.

Referring to FIG. 11A, insulation layers 110 and sacrificial layers 120 may be alternately and repeatedly stacked on a substrate 101 to form a mold stack 10. Vertical channel region holes 103 penetrating the mold stack 10 may be formed to expose the substrate 101, and vertical channel regions 140 may be formed to fill respective ones of the vertical channel region holes 103. Subsequently, the mold stack 10 may be patterned to form word line (WL) cuts 107.

Figure 11B:
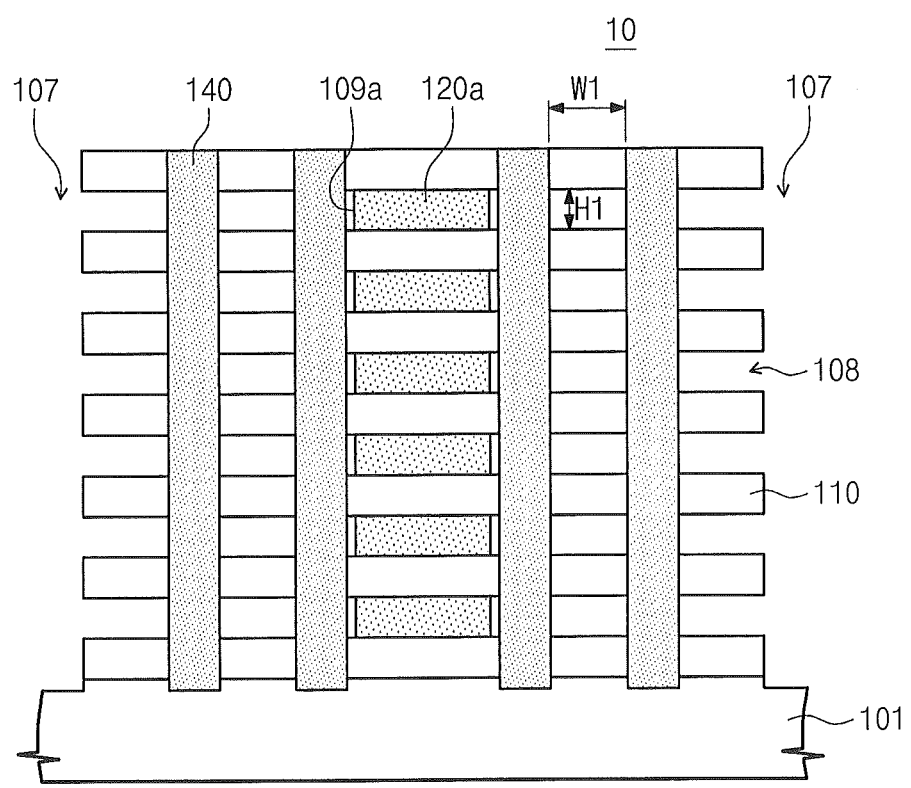

Referring to FIG. 11B, the sacrificial layers 120 may be partially etched using a first pull-back process, thereby forming first spaces 108 having a first width W1 and a first height H1 and remaining central portions 120a of the sacrificial layers 120. Further, the remained sacrificial layers 120a may be spaced apart from the vertical channel regions 140 by recessed regions 109a.

Figure 11C:
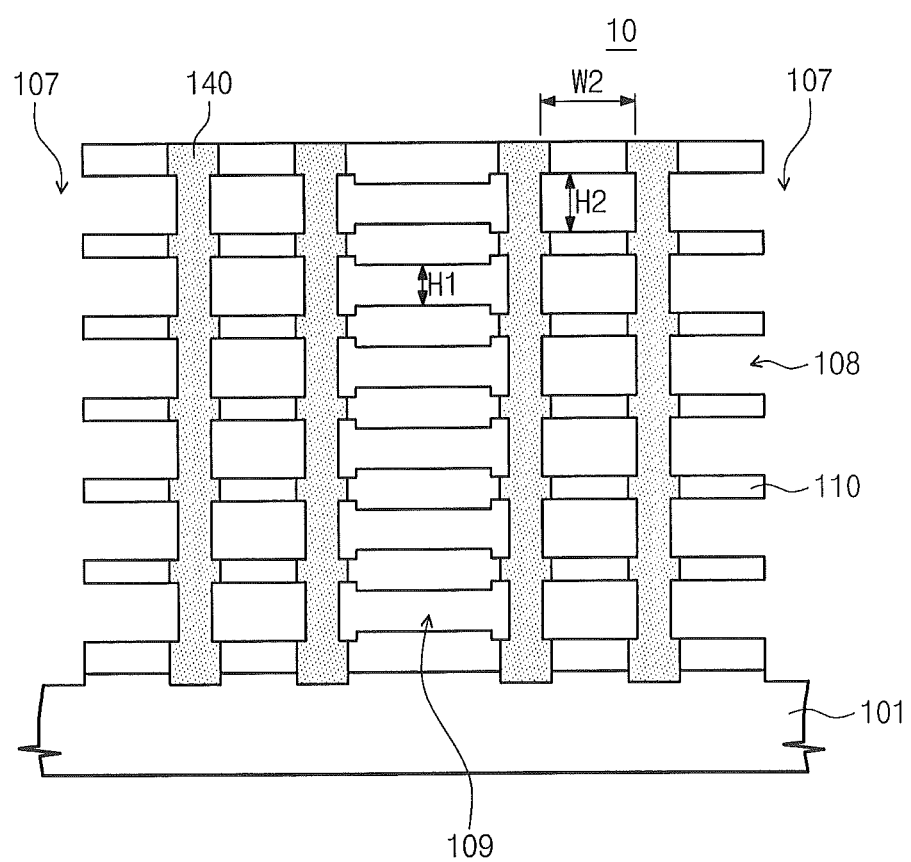

Referring to FIG. 11C, the first spaces 108 may be vertically and laterally enlarged using a pre-cleaning process and a trimming process. Thus, each of the first spaces 108 may have a second width W2 greater than the first width W1 and a second height H2 greater than the first height H1. Subsequently, the remained sacrificial layers 120a may be removed using a second pull-back process, thereby forming second spaces 109 having the first height H1.

Figure 11D:
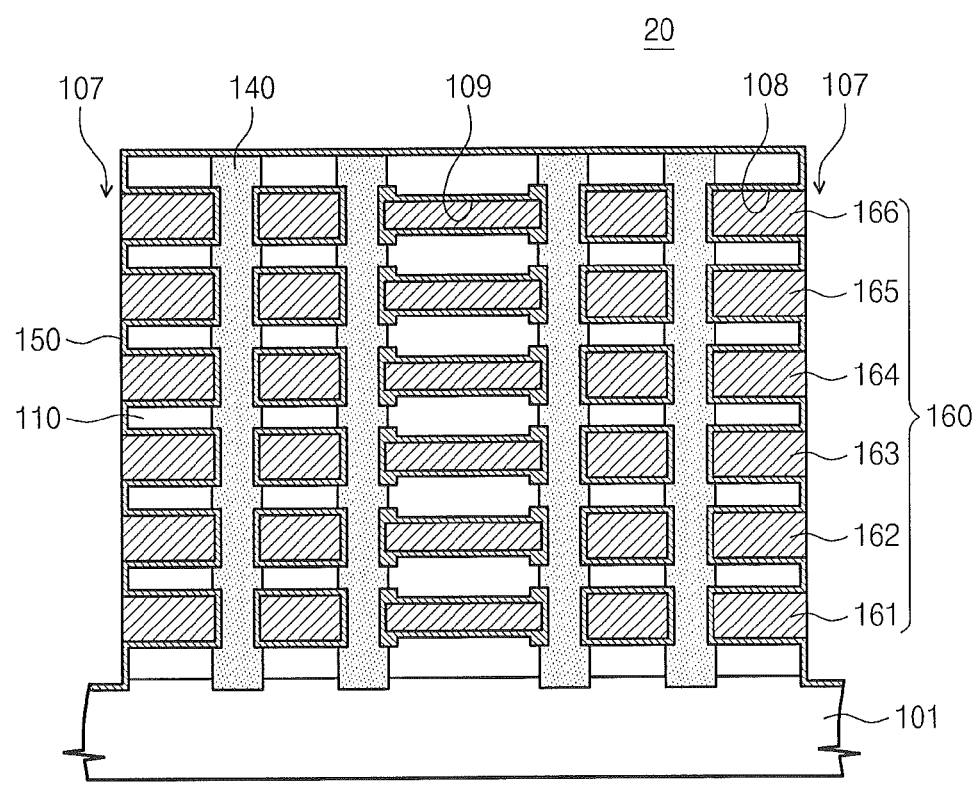

Referring to FIG. 11D, a data storage layer 150 may be conformally formed to cover inner surfaces of the first and second spaces 108 and 109. Gate electrodes 160 may be then formed to fill the first and second spaces 108 and 109. The gate electrodes 160 may constitute a gate stack 20. The gate electrodes 160 filling the second spaces 109 may be thinner than the gate electrodes 160 filling the first spaces 108.

Figure 11E:
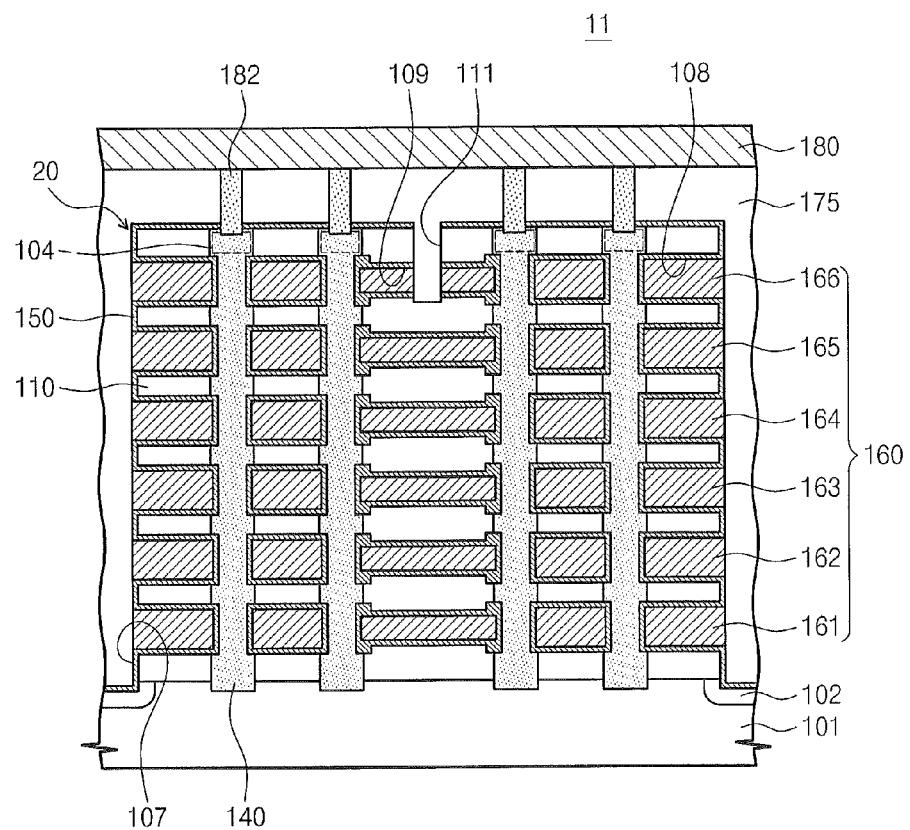

Referring to FIG. 11E, the uppermost insulation layer 110 and the uppermost gate electrode (e.g., a sixth gate electrode 166) in the second space 109 may be patterned to form a string selection line (SSL) cut 111. The SSL cut 111 may divide the sixth gate electrode 166 into two separate portions. According to the present exemplary embodiment, the sixth gate electrode 166 in one of the second spaces 109 may be thinner than the sixth gate electrode 166 in one of the first spaces 108, as described with reference to FIG. 11C. Thus, the burden on the etching process for forming the SSL cut 111 may be reduced. The insulation layers 110 between the second spaces 109 may be thicker than the insulation layers 110 between the first spaces 108. Thus, the process margin of the etching process for forming the SSL cut 111 may be increased.

Subsequently, an interlayer insulation layer 176 may be formed to fill the SSL cut 111 and the WL cuts 107 and to cover the uppermost insulation layer 110. Prior to formation of the interlayer insulation layer 176, impurities may be injected into the substrate 101 through the WL cuts 107 to form common sources 102 and impurities may be injected into upper portions of the vertical channel regions 140 to form drains 104. The common sources 102 and the drains 104 may be formed to have the same conductivity type. Plugs 182 penetrating the interlayer insulation layer 176 may be formed and may be electrically connected to respective ones of the drains 104. Bit lines 180 may be formed on the interlayer insulation layer 176. The bit lines 180 may be electrically connected to the plugs 182. Thus, the bit lines 180 may be electrically connected to vertical channel regions 140 through the plugs 182. As such, a semiconductor memory device 10 may be formed by the aforementioned processes.

At least one of the exemplary embodiments described above may be applied to fabrication of the semiconductor memory device 11.

APPLICATIONS

Figure 12A:
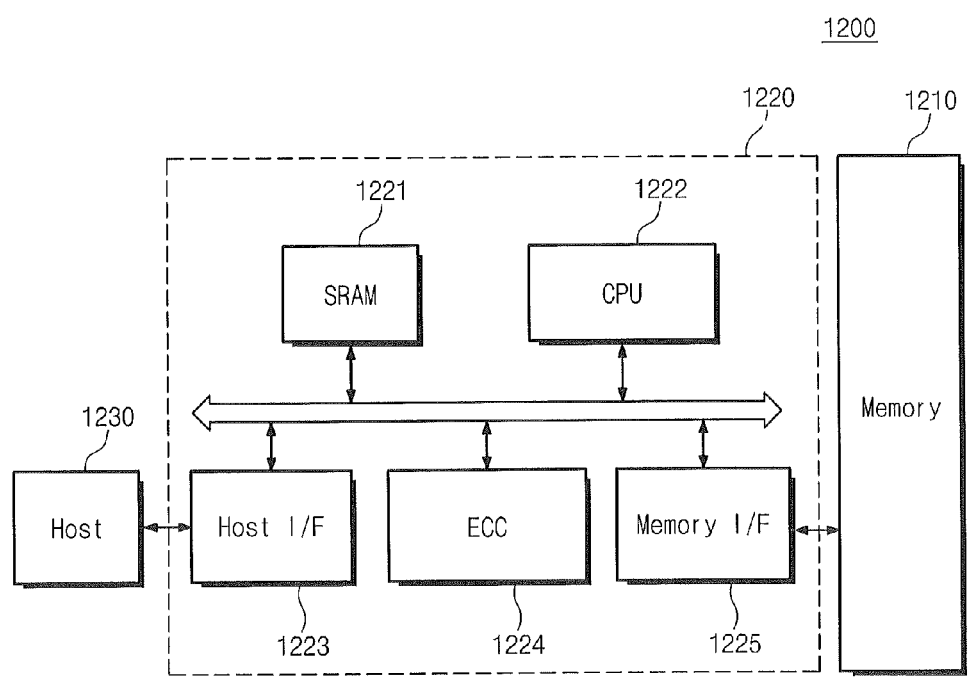
FIG. 12A is a block diagram illustrating an example of memory cards including semiconductor memory devices according to some exemplary embodiments.
Figure 12B:
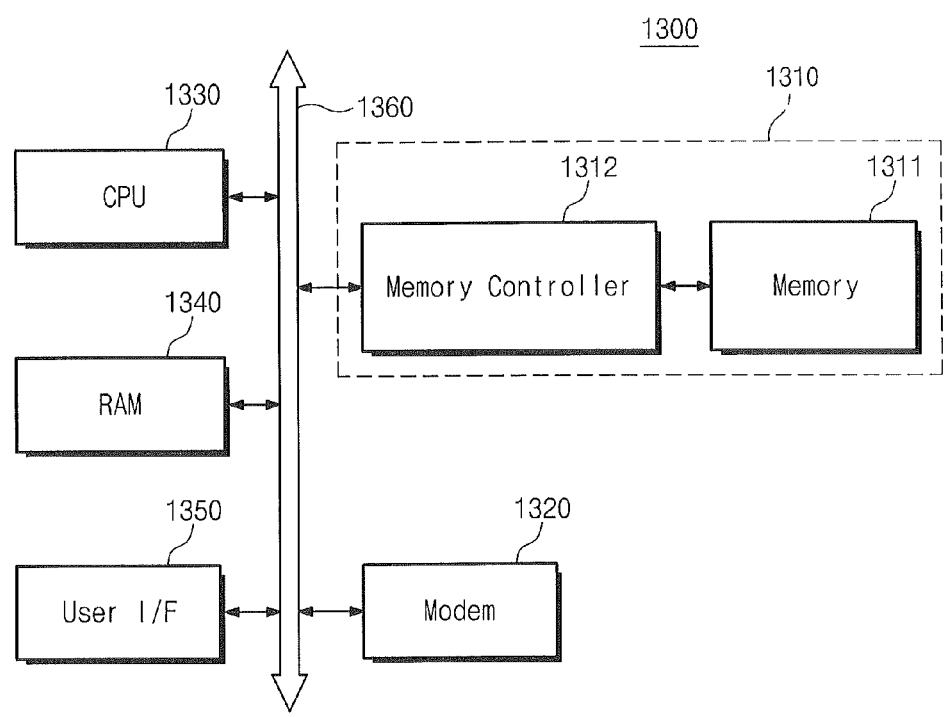
FIG. 12B is a block diagram illustrating an example of information processing systems including semiconductor memory devices according to some exemplary embodiments.

FIG. 12A is a block diagram illustrating an example of memory cards including semiconductor memory devices according to the exemplary embodiments, and FIG. 12B is a block diagram illustrating an example of information processing systems including semiconductor memory devices according to the exemplary embodiments.

Referring to FIG. 12A, a memory device 1210 including at least one of the semiconductor memory devices 1 to 10 according to the embodiments described above may be applied to a memory card 1200. The memory card 1200 may include a memory controller 1220 that controls data communication between a host 1230 and the memory device 1210. The memory controller 1220 may include a central processing unit (CPU) 1222, a static random access memory (SRAM) device 1221, a host interface unit 1223, an error check and correction (ECC) block 1224, and a memory interface unit 1225. The SRAM device 1221 may be used as an operation memory of the CPU 1222. The host interface unit 1223 may be configured to include a data communication protocol of the host 1230 connected to the memory card 1200. The ECC block 1224 may detect and correct errors of data which are read out from the memory device 1210. The memory interface unit 1225 may control the communication between the memory controller 1220 and the memory device 1210. The CPU 1222 may control overall operations of the memory controller 1220.

Referring to FIG. 12B, an information processing system 1300 may include a memory system 1310 having at least one of the semiconductor memory devices 1 to 10 according to the exemplary embodiments described above. The information processing system 1300 may include a mobile system, a computer or the like. The information processing system 1300 may include the memory system 1310, a modulator-demodulator (MODEM) 1320, a central processing unit (CPU) 1330, a random access memory (RAM) device 1340 and a user interface unit 1350 that communicate with each other through a data bus 1360. The memory system 1310 may include a memory device 1311 and a memory controller 1312. The memory system 1310 may have substantially the same configuration as the memory card 1200 illustrated in FIG. 12A. The memory system 1310 may store data processed by the CPU 1330 or data transmitted from an external system. The information processing system 1300 may be applied to a memory card, a solid state disk, a camera image sensor or an application chipset. In particular, the memory system 1310 may include the solid state disk. In this case, the information processing system 1300 may stably and reliably operate since the solid state disk can stably store large capacity of data.

According to the embodiments set forth above, a deposition process gas may be sequentially flowed into first spaces and second spaces, thereby forming gate electrodes in the first and second spaces. Each of the first spaces may have a greater dimension than each of the second spaces. Thus, a deposition process gas for forming the gate electrodes may be harmoniously and/or smoothly flowed into the first spaces and the second spaces. Consequently, the configuration of the first and second spaces and may prevent or minimize formation of voids in the gate electrodes. Accordingly, electrical characteristics and reliability of a semiconductor device including the gate electrodes can be improved.

While the inventive subject matter has been described with reference to example embodiments, it will be apparent to those skilled in the art that various changes and modifications may be made without departing from the spirit and scope of the inventive subject matter. Therefore, it should be understood that the above embodiments are not limiting, but illustrative. Thus, the scope of the inventive subject matter is to be determined by the broadest permissible interpretation of the following claims and their equivalents, and shall not be restricted or limited by the foregoing description.

What is claimed is:
1. A method comprising:
  forming a mold stack comprising alternating insulation layers and sacrificial layers on a substrate;
  forming vertical channel regions extending through the insulation layers and sacrificial layers of the mold stack;

removing portions of the sacrificial layers in a first part of the mold stack to form first spaces and to leave portions of the sacrificial layers remaining between the insulation layers in a second part of the mold stack;

enlarging the first spaces by removing portions of the insulating layers and/or the vertical channel regions;

removing the remaining portions of the sacrificial layers in the second part of the mold stack to form second spaces between the insulating layers after enlarging the first spaces; and forming gate electrodes in the first and second spaces.

2. The method of claim 1, wherein the first part of the mold stack comprises an outer portion and wherein the second part of the mold stack comprises an inner portion.

3. The method of claim 1, wherein forming gate electrodes is preceded by forming at least one data storage layer on sidewalls of the vertical channel regions and wherein forming gate electrodes comprises forming the gate electrodes on the at least one data storage layer.

4. The method of claim 1, wherein enlarging the first spaces comprises increasing a width of the first spaces and/or increasing a height of the first spaces.

5. The method of claim 4, wherein increasing a height of the first spaces comprises removing exposed portions of the insulation layers in the first spaces.

6. The method of claim 4, wherein increasing a width of the first spaces comprises removing exposed portions of the vertical channel regions in the first spaces.

7. The method of claim 4, wherein forming the first spaces and increasing the height of the first spaces are simultaneously performed, and wherein the increased height of the first spaces is gradually increased from a central portion of the mold stack toward edges of the mold stack.

8. The method of claim 1, wherein removing portions of the sacrificial layers in a first part of the mold stack to form first spaces and to leave portions of the sacrificial layers remaining between the insulation layers in a second part of the mold stack comprises exposing sidewalls of the vertical channel regions adjacent the remaining sacrificial layers.

9. The method of claim 8, wherein enlarging the first spaces includes removing exposed portions of the vertical channel regions in the first spaces to enlarge the first spaces.

10. The method of claim 1, further comprising forming a cut defining a region that vertically penetrates at least an uppermost sacrificial layer among the sacrificial layers to divide the at least uppermost sacrificial layer into two separate portions.

11. The method of claim 1, further comprising forming a cut defining a region that vertically penetrates at least an uppermost gate among the gates filling the second spaces to divide the at least uppermost gate into two separate portions.

12. The method of claim 1, wherein the enlarged first spaces have a greater height than the second spaces.

13. A method comprising:

forming a mold stack comprising alternating insulation layers and sacrificial layers on a substrate;

forming vertical channel regions extending through the insulation layers and sacrificial layers of the mold stack; and forming gate electrodes between adjacent ones of the insulation layers and surrounding the vertical channel regions wherein the gate electrodes have a greater thickness at a first location near sidewalls of the insulation layers than at a second location further away from the sidewalls of the insulation layers.

14. The method of claim 13, further comprising forming at least one data storage layer on the vertical channel regions before forming the gate electrodes and wherein forming gate electrodes comprises forming the gate electrodes on the at least one data storage layer.

15. The method of claim 13, wherein the gate electrodes decrease in thickness away from the sidewalls of the insulation layers in a stepwise or gradual manner.

* * * * *